US012771359B2

(12) United States Patent
Jin et al.

(10) Patent No.: US 12,771,359 B2
(45) **Date of Patent: *Oct. 20, 2026**

(54) FREQUENCY DETECTOR AND OPERATING METHOD THEREOF

(71) Applicant: Samsung Electronics Co., Ltd., Suwon-si (KR)

(72) Inventors: Jahoon Jin, Suwon-si (KR); Sangho Kim, Suwon-si (KR); Kyunghwan Min, Suwon-si (KR); Soomin Lee, Suwon-si (KR); Sodam Ju, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 19/207,800

(22) Filed: May 14, 2025

(65) Prior Publication Data

US 2025/0274131 A1 Aug. 28, 2025

Related U.S. Application Data

(63) Continuation of application No. 18/361,059, filed on Jul. 28, 2023, now Pat. No. 12,323,154.

(30) Foreign Application Priority Data

Feb. 13, 2023 (KR) ........................ 10-2023-0018843

(51) Int. Cl.
*H03L 7/091* (2006.01)

(52) U.S. Cl.
CPC .................................... *H03L 7/091* (2013.01)

(58) Field of Classification Search
CPC ...................................................... H03L 7/091
See application file for complete search history.

(56) References Cited

U.S. PATENT DOCUMENTS 7,692,501 B2 4/2010 Hsueh et al.
7,977,992 B2 7/2011 Farmer
(Continued)

OTHER PUBLICATIONS

S. Choi et al. 'A 0.65-to-10.5 GB/s Reference-Less CDR With Asynchronous Baud-Rate Sampling for Frequency Acquisition and Adaptive Equalization' IEEE Transactions on Circuits and Systems—I, vol. 63, No. 2, Feb. 2016, pp. 276-287.
(Continued)

*Primary Examiner* — Patrick O Neill
(74) *Attorney, Agent, or Firm* — Harness, Dickey & Pierce, P.L.C.

(57) ABSTRACT

Disclosed is a frequency detector. The frequency detector includes a first flip-flop sampling a clock signal based on a data signal to generate a first signal, a second flip-flop sampling a delayed-phase component of the clock signal based on the data signal or sampling the clock signal based on a delayed-phase component of the data signal to generate a second signal, a third flip-flop generating a third signal representing a polarity of a frequency difference between a data rate of the data signal and a frequency of the clock signal based on the first signal and the second signal, and a delay cell generating the delayed-phase component of the clock signal or the delayed-phase component of the data signal. The delayed-phase component has a delay amount set to a value smaller than about 0.25 UI.

20 Claims, 19 Drawing Sheets

(56) References Cited

U.S. PATENT DOCUMENTS

| | | | |
|---|---|---|---|
| 8,497,708 B2 | 7/2013 | Mukherjee et al. | |
| 8,502,609 B2 | 8/2013 | Kargar et al. | |
| 8,947,167 B2 | 2/2015 | Kargar et al. | |
| 9,160,353 B2 | 10/2015 | Hsueh et al. | |
| 9,584,303 B1 | 2/2017 | Gu et al. | |
| 10,607,672 B2 | 3/2020 | Shin et al. | |
| 10,873,444 B2 | 12/2020 | Manian et al. | |
| 12,323,154 B2 * | 6/2025 | Jin | H03L 7/0807 |
| 2002/0135400 A1 | 9/2002 | Liu et al. | |
| 2007/0071156 A1 | 3/2007 | Gregorius et al. | |
| 2010/0264967 A1 | 10/2010 | Lee et al. | |
| 2013/0108001 A1 | 5/2013 | Chang et al. | |

OTHER PUBLICATIONS

J. Jin et al. 'A 0.75-3.0-GB/s Dual-Mode Temperature-Tolerant Referenceless CDR With a Deadzone-Compensated Frequency Detector' IEEE Journal of Solid-State Circuits, vol. 53, No. 10, Oct. 2018, pp. 2994-3003.

N. Kocaman, et al. 'An 8.5-11.5-Gbps SONET Transceiver With Referenceless Frequency Acquisition' IEEE Journal of Solid-State Circuits, vol. 48, No. 8, Aug. 2013, pp. 1875-1884.

* cited by examiner

FREQUENCY DETECTOR AND OPERATING METHOD THEREOF

CROSS-REFERENCE TO RELATED APPLICATIONS

This application is a Continuation of U.S. application Ser. No. 18/361,059, filed on Jul. 28, 2023, which claims priority under 35 U.S.C. § 119 to Korean Patent Application No. 10-2023-0018843 filed on Feb. 13, 2023, in the Korean Intellectual Property Office, the contents of each of which are hereby incorporated by reference in their entirety.

BACKGROUND

Example embodiments of the present disclosure described herein relate to a frequency detector and/or an operating method thereof.

A conventional frequency detector may have a frequency detection range of about ±15%, and, thus, an error may occur in a process of detecting the frequency when an offset between a frequency of a system clock and a data transfer rate is equal to or greater than about 15%.

As such, since a frequency of a clock provided by an oscillator may change within a range of about ±20% depending on PVT (process, voltage, and temperature) variations, it may be difficult to reliably detect the frequency.

Accordingly, to reliably detect the frequency, demands for the technology capable of widening the frequency detection range increase.

SUMMARY

Example embodiments of the present disclosure provide a frequency detector having a wide frequency detection range and/or a method of operating the frequency detector.

According to the above, a valid frequency detection is possible in a wider frequency range.

Some example embodiments relate to a frequency detector including a first flip-flop configured to generate a first signal by sampling a clock signal based on a data signal; a second flip-flop configured to generate a second signal by (i) sampling a delayed-phase component of the clock signal based on the data signal or (ii) sampling the clock signal based on a delayed-phase component of the data signal; a third flip-flop configured to generate a third signal based on the first signal and the second signal such that the third signal represents a polarity of a frequency difference between a data rate of the data signal and a frequency of the clock signal; and a delay cell configured to generate the delayed-phase component of the clock signal or the delayed-phase component of the data signal such that a delay amount thereof is less than 0.25 Unit Interval (UI).

Some example embodiments relate to a method of operating a frequency detector, the method including sampling a clock signal based on a data signal to generate a first signal; sampling a delayed-phase component of the clock signal based on the data signal or sampling the clock signal based on a delayed-phase component of the data signal to generate a second signal; and generating a third signal based on the first signal and the second signal such that the third signal represents a polarity of a frequency difference between a data rate of the data signal and a frequency of the clock signal, wherein the delayed-phase component of the clock signal or the delayed-phase component of the data signal has a delay amount less than 0.25 Unit Interval (UI).

Some example embodiments relate to a frequency detection system including a frequency detector configured to, generate a first signal by sampling a clock signal based on a data signal, generate a second signal by (i) sampling a delayed-phase component of the clock signal based on the data signal or (ii) sampling the clock signal based on a delayed-phase component of the data signal, and generate a third signal based on the first signal and the second signal such that the third signal represents a polarity of a frequency difference between a data rate of the data signal and a frequency of the clock signal; an oscillator configured to provide the clock signal to the frequency detector; and a control circuit configured to control an operation of the oscillator based on an average value of the third signal to adjust the frequency of the clock signal, wherein the delayed-phase component of the clock signal or the delayed-phase component of the data signal has a delay amount less than about 0.25 Unit Interval (UI).

BRIEF DESCRIPTION OF THE FIGURES

The above and other objects and features of the present disclosure will become apparent by describing in detail embodiments thereof with reference to the accompanying drawings.

DETAILED DESCRIPTION

Hereinafter, example embodiments of the present disclosure will be described clearly and in detail to such an extent that those skilled in the art easily implement the present disclosure.

In the present disclosure, the terms 'first', 'second', etc. may be used to refer to various components without regard to their spatial order and/or importance. They can be used to differentiate one component from another, but not to define components.

Figure 1:
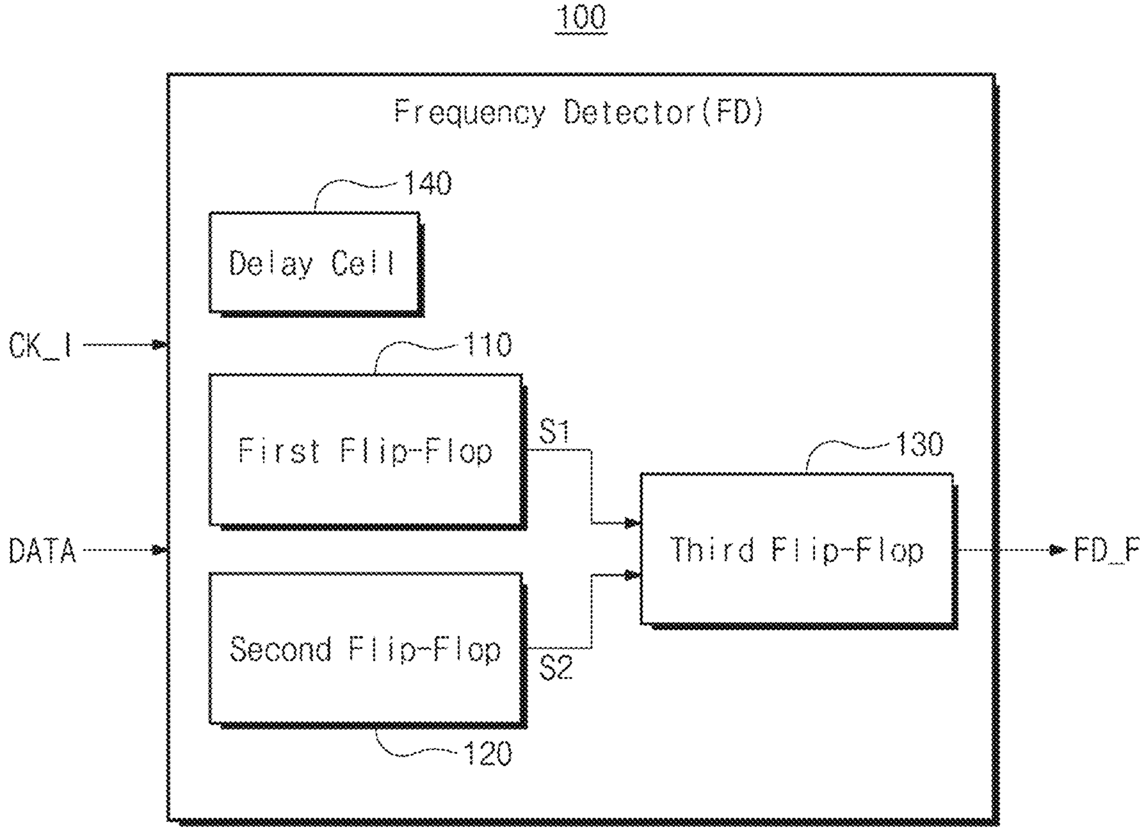
FIG. 1 is a block diagram illustrating a frequency detector according to an example embodiment of the present disclosure.

FIG. 1 is a block diagram illustrating a frequency detector 100 according to an example embodiment of the present disclosure.

Referring to FIG. 1, the frequency detector 100 may receive a clock signal CK_I and a data signal DATA and may detect a difference in frequency between the clock signal CK_I and a data rate of the data signal DATA. As an example, when the frequency of the clock signal CK_I is higher than the frequency of the data signal DATA, the frequency detector 100 may output a detection signal FD_F with a high value, and when the frequency of the clock signal CK_I is lower than the frequency of the data signal DATA, the frequency detector 100 may output the detection signal FD_F with a low value.

In this case, the frequency detector 100 may delay the clock signal CK_I or the data signal DATA by less than about 0.25 of a Unit Interval (UI) and may detect the frequency difference between the clock signal CK_I and the data signal DATA using the delayed clock signal or the delayed data signal. In the present example embodiment, a UI may mean a data UI based on the data rate of the data signal, but it should not be limited thereto or thereby. In the present example embodiment, since the clock signal CK_I or the data signal DATA is delayed to less than about 0.25 UI, a probability of outputting the detection signal FD_F that is false may be reduced in a region where the frequency of the clock signal CK_I is lower than the frequency of the data signal DATA, and thus, the frequency detector 100 may have a wide frequency detection range.

Referring to FIG. 1 in more detail, the frequency detector 100 may receive the clock signal CK_I and the data signal DATA and may output a signal representing a polarity of the frequency difference between the data rate of the data signal DATA and the frequency of the clock signal CK_I.

To this end, the frequency detector 100 may include a first flip-flop 110, a second flip-flop 120, a third flip-flop 130, and a delay cell 140. In this case, each of the first, second, and third flip-flops 110, 120, and 130 may be a D flip-flop, however it should not be limited thereto or thereby.

The first flip-flop 110 may sample the clock signal CK_I based on the data signal DATA and may generate a first signal S1.

The second flip-flop 120 may sample a delayed-phase component of the clock signal based on the data signal DATA and may generate a second signal S2. In addition, the second flip-flop 120 may sample the clock signal CK_I based on a delayed-phase component of the data signal and may generate the second signal S2.

In this case, the delayed-phase component of the clock signal refers to a clock signal whose phase is delayed by a desired (or, alternatively, a predetermined) amount based on the clock signal CK_I. In addition, the delayed-phase component of the data signal refers to a data signal whose phase is delayed by a desired (or, alternatively, a predetermined) amount based on the data signal DATA.

The delay cell 140 may be used to change a phase of an input signal and may be implemented by various well-known delay circuits or delay buffers. In particular, the delay cell 140 may delay the phase of the clock signal CK_I input into the frequency detector 100 by the desired (or, alternatively, predetermined) amount and may generate the delayed-phase component of the clock signal. In addition, the delay cell 140 may delay the phase of the data signal DATA input into the frequency detector 100 by the desired (or, alternatively, predetermined) amount and may generate the delayed-phase component of the data signal.

In this case, according to various example embodiments of the present disclosure, the desired (or, alternatively, predetermined) amount may have a value smaller than about 0.25 UI (Unit interval). In particular, according to an example embodiment, the desired (or, alternatively, the predetermined) amount may have a value between about 0.1 UI and about 0.15 UI, however, it should not be limited thereto or thereby.

As an example, in a case where a delay amount set in the delay cell 140 is about 0.125 UI, the delay cell 140 may apply the set delay amount to the clock signal CK_I and may generate a clock signal CK_I+0.125 UI whose phase is delayed by about 0.125 UI. In addition, the delay cell 140 may apply the set delay amount to the data signal DATA and may generate a data signal DATA+0.125 UI whose phase is delayed by about 0.125 UI.

The delayed-phase component of the clock signal or the delayed-phase component of the data signal, which are generated as described above, may be provided to the second flip-flop 120, and the second flip-flop 120 may sample the delayed-phase component of the clock signal based on the data signal DATA to generate the second signal S2 or may sample the clock signal CK_I based on the delayed-phase component of the data signal to generate the second signal S2.

The third flip-flop 130 may generate the third signal FD_F that represents the polarity of the frequency difference between the data rate of the data signal DATA and the frequency of the clock signal CK_I based on the first signal S1 and the second signal S2. As an example, the third flip-flop 130 may generate the third signal FD_F with the high value when the frequency of the clock signal CK_I is faster than the data rate of the data signal DATA and may generate the third signal FD_F with the low value when the frequency of the clock signal CK_I is slower than the data rate of the data signal DATA.

Meanwhile, the third flip-flop 130 may output the generated third signal FD_F to a control circuit that controls an operation of the oscillator providing the clock signal CK_I. Accordingly, the control circuit may control the operation of the oscillator to change the frequency of the clock signal CK_I based on the third signal FD_F.

As an example, in a case where an average value of the third signal FD_F is closer to the low value than the high value, the control circuit may apply a control signal to the oscillator to increase the frequency of the clock signal CK_I. In addition, in a case where the average value of the third signal FD_F is closer to the high value than the low value, the control circuit may apply a control signal to the oscillator to decrease the frequency of the clock signal CK_I. Thus, the oscillator may change the frequency of the clock signal CK_I based on the control signal.

When the clock signal whose frequency is changed is provided from the oscillator, the frequency detector 100 may repeat the above-described operation based on the data signal and the clock signal with the changed frequency. Since the data rate of the data signal is constant, the frequency of the clock signal CK_I corresponding to the data rate, i.e., the data rate, may be detected by repeating the above-described operation until the average value of the third signal FD_F becomes 0 or is within a margin of error.

As will be described in detail later, a conventional frequency detector may detect a frequency using a clock signal, i.e., an in-phase component of the clock signal, and a quadrature-phase component of the clock signal. In this case, the in-phase component and the quadrature-phase component may have a phase difference of about 90°, and when this phase difference is converted based on the data UI, the phase difference may be expressed as about 0.25 UI. In this case, a frequency determination range of the conventional frequency detector has a narrow frequency-detection range of about +15% based on the data rate of the data signal. That is, the conventional frequency detector is not able to detect the frequency normally in a frequency range exceeding about +15% based on the data rate.

However, according to various example embodiments of the present disclosure, as described above, the value smaller than about 0.25 UI may be used as the delay amount of the delayed-phase component of the clock signal CK_I or the data signal DATA. In this case, a probability that the frequency detector 100 outputs the low value or the high value may be changed differently from the conventional frequency detector depending on the frequency difference between the clock signal CK_I and the data signal DATA, and as a result, the frequency may be detected in a wider frequency range.

Figure 2:
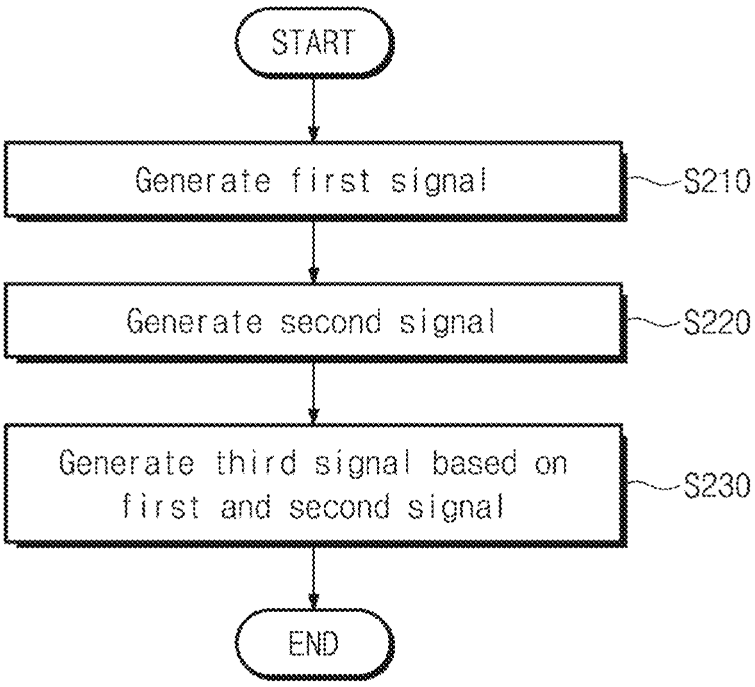
FIG. 2 is a flowchart illustrating a method of operating a frequency detector according to an example embodiment of the present disclosure.

FIG. 2 is a flowchart illustrating a method of operating the frequency detector according to an embodiment of the present disclosure.

In operation S210, when clock signal CK_I and the data signal DATA are input, the frequency detector 100 may sample the clock signal CK_I based on the data signal DATA to generate the first signal S1.

In operation S220, when the clock signal CK_I and the data signal DATA are input, the frequency detector 100 may sample the delayed-phase component of the clock signal based on the data signal DATA or may sample the clock signal CK_I based on the delayed-phase component of the data signal to generate the second signal S2.

In detail, the frequency detector 100 may generate the delayed-phase component of the clock signal input thereto and may sample the generated delayed-phase component of the clock signal based on the data signal DATA to generate the second signal S2. In this case, the delayed-phase component of the clock signal may indicate the signal whose phase is delayed by the desired (or, alternatively, the predetermined) amount based on the clock signal CK_I.

In addition, the frequency detector 100 may generate the delayed-phase component of the data signal input thereto and may sample the clock signal CK_I based on the generated delayed-phase component of the data signal to generate the second signal S2. In this case, the delayed-phase component of the data signal may indicate the data signal whose phase is delayed by the desired (or, alternatively, the predetermined) amount based on the data signal.

In operation S230, the frequency detector 100 may generate the third signal FD_F that represents the polarity of the frequency difference between the data rate of the data signal DATA and the frequency of the clock signal CK_I based on the first signal S1 and the second signal S2.

The third signal FD_F generated in this way may be applied to the control circuit that controls the operation of the oscillator, and the control circuit may control the operation of the oscillator to change the frequency of the clock signal CK_I based on the average value of the third signal FD_F.

Meanwhile, when the clock signal having the changed frequency is provided from the oscillator, the frequency detector 100 may repeat the operations S210 to S230 based on the clock signal having the changed frequency and the data signal.

Since the data rate of the data signal is constant, the data rate may be detected by detecting the frequency of the clock signal, which corresponds to the data rate, through the above-described operations.

According to various embodiments of the present disclosure, the value smaller than about 0.25 UI may be set as the delay amount of the delayed-phase component of the clock signal or the data signal. As an example, the value within a range from about 0.1 UI to about 0.15 UI may be set as the delay amount of the delayed-phase component. Accordingly, it is possible to detect the frequency in the wider frequency range compared with a conventional method that detects the frequency using the in-phase component and the quadrature-phase component of the clock signal or the data signal. In addition, since the number of phases of the clock used to detect the frequency decreases to one, a manufacturing cost of clock-related circuits may be reduced.

Hereinafter, to facilitate an understanding of the present disclosure, a configuration and operation of a conventional full-rate frequency detector will first be described with reference to FIGS. 3A to 3I. Then, various example embodiments of the present disclosure will be described with reference to the remaining drawings. In the descriptions with reference to FIGS. 3A to 3I, the contents that are not inconsistent with the present disclosure may be applied to various embodiments of the present disclosure.

Figure 3A:
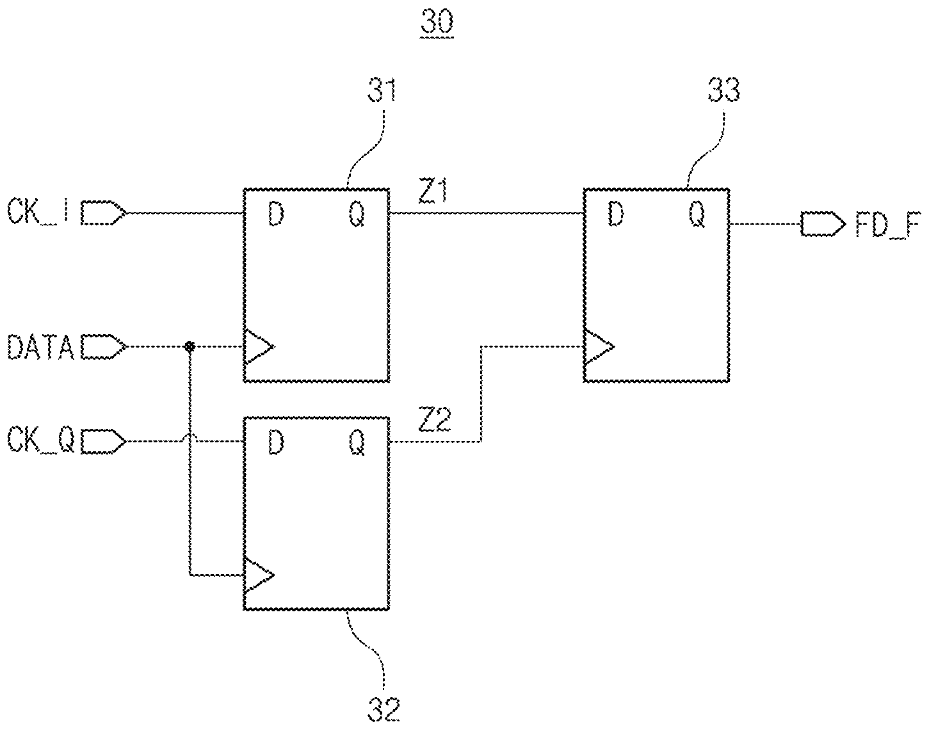
FIG. 3A is a circuit diagram illustrating a conventional frequency detector.

FIG. 3A is a circuit diagram illustrating the conventional full-rate frequency detector 30.

Referring to FIG. 3A, the frequency detector 30 operates in response to an in-phase clock signal CK_I, a quadrature-phase clock signal CK_Q, and a data signal DATA, which are applied thereto.

In detail, the frequency detector 30 detects how the phase relationship between the data signal DATA and the clock signal CK_I is changed over time using three D flip-flops 31, 32, and 33. Accordingly, the frequency detector 30 outputs a signal FD_F that represents a polarity of a frequency difference between the clock signal CK_I and the data signal DATA.

As an example, when the frequency of the clock signal is higher than a data rate of the data signal, the frequency detector 30 outputs the output signal FD_F with a high value, and when the frequency of the clock signal is lower than the data rate of the data signal, the frequency detector 30 outputs the output signal FD_F with a low value.

Hereinafter, the operation of the frequency detector 30 will be described in detail with reference to FIGS. 3B to 3F.

Figure 3B:
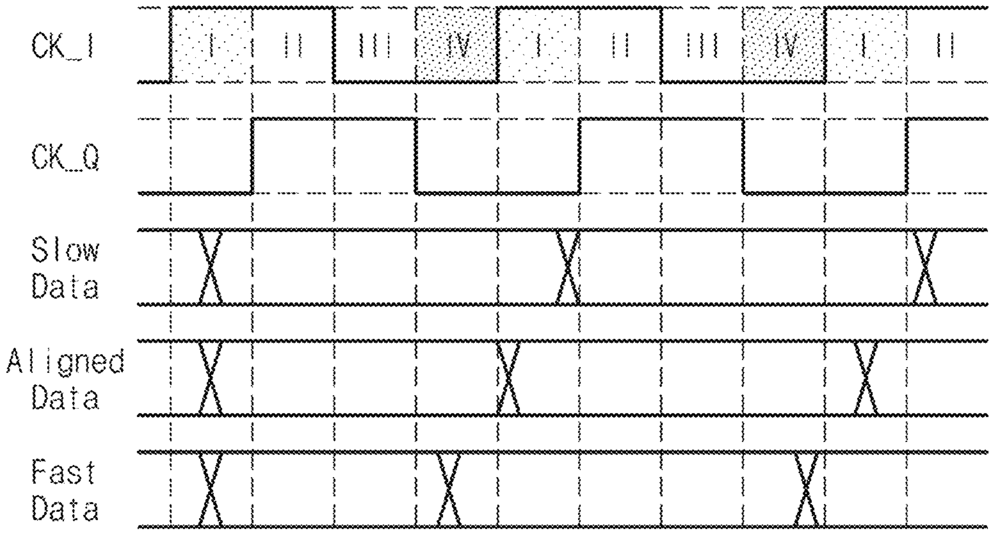
FIG. 3B is a view illustrating a state model of the frequency detector of FIG. 3A.

FIG. 3B is a view illustrating a state model of the frequency detector 30 of FIG. 3A.

Referring to FIGS. 3A and 3B, in FIG. 3B, a signal "CK_I" denotes the in-phase clock signal, a signal "CK_Q" denotes the quadrature-phase clock signal, a signal "Aligned Data" denotes the data signal when the frequency of the clock signal matches the data rate, a signal "Slow Data" denotes the data signal when the data rate is lower than the frequency of the clock signal, and a signal "Fast Data" denotes the data signal when the data rate is higher than the frequency of the clock signal. In this case, the signal CK_Q has the same frequency as that of the signal CK_I, and only a phase of the signal CK_Q is delayed by about 90° with respect to the signal CK_I.

The flip-flop 31 of FIG. 3A samples the in-phase clock signal CK_I at a rising edge of the data signal DATA and outputs a signal Z1, and the flip-flop 32 of FIG. 3A samples the quadrature-phase clock signal CK_Q at the rising edge of the data signal DATA and outputs a signal Z2.

The value of the in-phase clock signal CK_I and the value of the quadrature-phase clock signal CK_Q, that is, the values of (Z1, Z2), may be expressed in four ways depending on a position of the rising edge of the data signal DATA. In detail, when the high and low values of the clock signals CK_I and CK_Q are expressed as 1 and 0, respectively, the values of (Z1, Z2) may have four values such as (1, 0), (1, 1), (0, 1), and (0, 0).

As an example, a case where the values of (Z1, Z2) are (1, 0) is defined as a first state (I), a case where the values of (Z1, Z2) are (1, 1) is defined as a second state (II), a case where the values of (Z1, Z2) are (0, 1) is defined as a third state (III), and a case where the values of (Z1, Z2) are (0, 0) is defined as a fourth state (IV).

Since the "state" is changed depending on the phase relationship between the signals (e.g., the clock signal and the data signal) input to the frequency detector 30, the "state" may be the state of the input signals. However, as described above, since the states of the input signals are distinguished and defined through the values of Z1 and Z2 and the values of Z1 and Z2 are signals generated by the frequency detector 30, the "state" may be regarded as the state of the frequency detector 30. The expression "state of the frequency detector" used below will be understood in this sense.

The in-phase clock signal CK_I and the quadrature-phase clock signal CK_Q, which are used in the conventional frequency detector 30, have the phase difference of about 90°. Accordingly, referring to FIG. 3B, in a case where an edge of the data signal is located between about 0° to about 90° with respect to the in-phase clock signal CK_I, the state of the frequency detector 30 is the first state (I). Similarly, in cases where an edge of the data signal is located between about 90 to about 180°, between about 180° to about 270°, and between about 270° to about 360°, the states of the frequency detector 30 are the second state (II), the third state (III), and the fourth state (IV), respectively.

Meanwhile, referring to FIG. 3B, different from the signal "Aligned Data", it is expected that the state of the frequency detector 30 will be changed over time in the case of the signal "Slow Data" or the signal "Fast Data". That is, the state of the frequency detector 30 is changed depending on the frequency relationship between the clock signals CK_I and CK_Q and the data signal DATA.

Figure 3C:
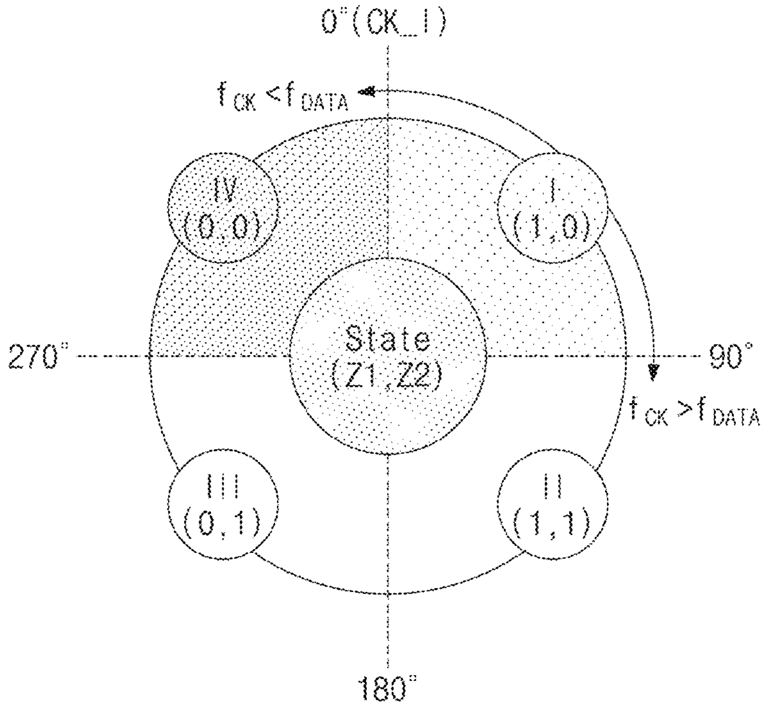
FIG. 3C is a state diagram illustrating the frequency detector of FIG. 3A.

FIG. 3C is a state diagram illustrating a change of the state of the frequency detector 30 of FIG. 3A according to the frequency relationship between the clock signals and the data signal.

Referring to FIG. 3C, the first, second, third, and fourth states I, II, III, and IV are shown after being separated from each other based on the phase of the in-phase clock signal CK_I. In this case, when a frequency $f_{CK}$ of the clock signal is higher than a data rate $f_{DATA}$, the state of the frequency detector 30 rotates in a clockwise direction, and when the frequency $f_{CK}$ of the clock signal is lower than the data rate $f_{DATA}$, the state of the frequency detector 30 rotates in a counter-clockwise direction. This state change may also be observed through the timing diagrams of FIGS. 3D and 3E.

Figure 3D:
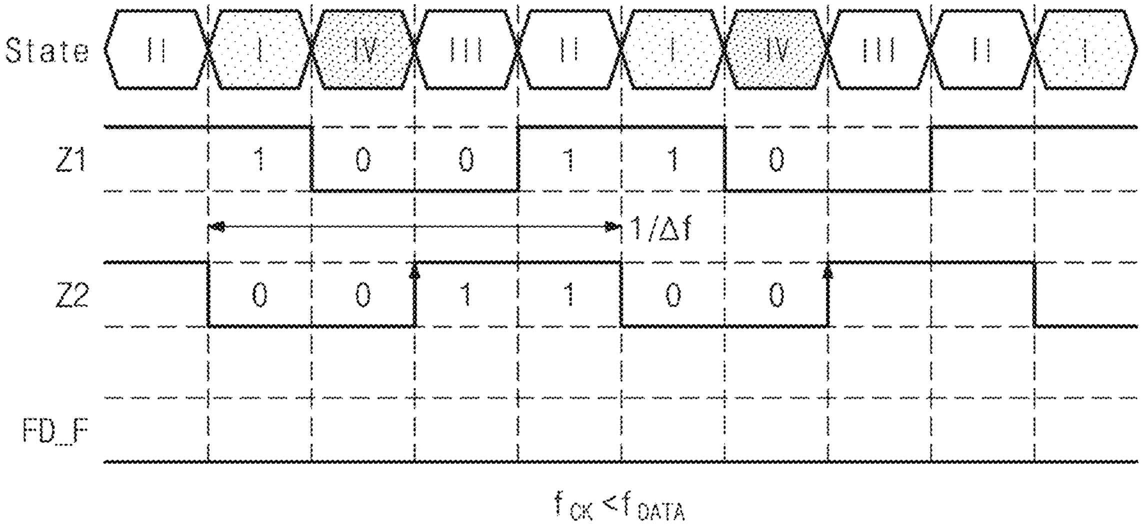
FIG. 3D is a timing diagram illustrating the frequency detector of FIG. 3A.
Figure 3E:
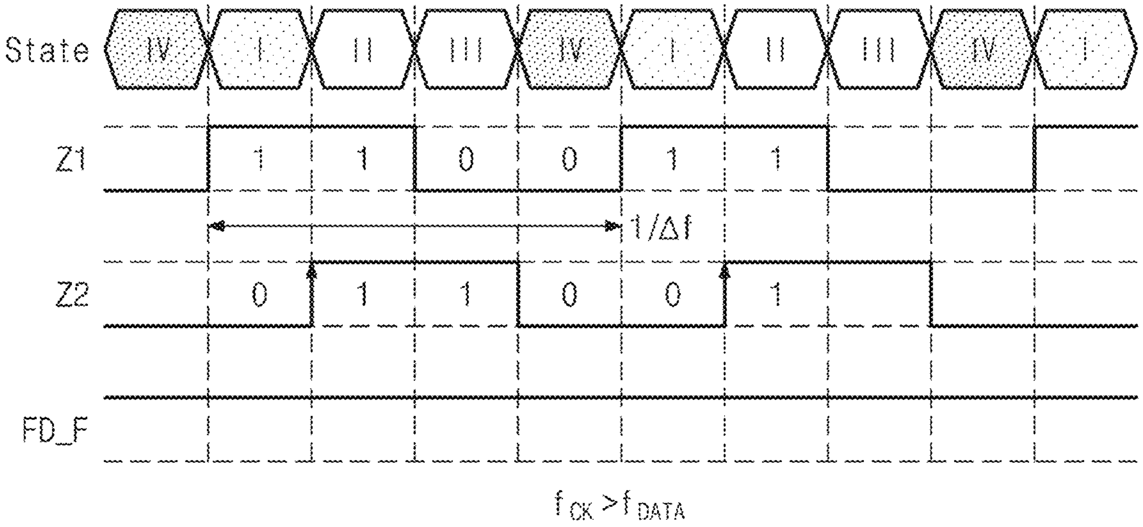
FIG. 3E is a timing diagram illustrating the frequency detector of FIG. 3A.

FIG. 3D shows a timing diagram of the frequency detector 30 when the frequency $f_{CK}$ of the clock signal is lower than the data rate $f_{DATA}$, and FIG. 3E shows a timing diagram of the frequency detector 30 when the frequency $f_{CK}$ of the clock signal is higher than the data rate $f_{DATA}$.

Referring to FIGS. 3D and 3E, in detail, in the case where the frequency $f_{CK}$ of the clock signal is lower than the data rate $f_{DATA}$, signals in the form of a clock shown in FIG. 3D are obtained when the values of Z1 and Z2 of the frequency detector 30 are drawn in sequence. Referring to FIG. 3D, the Z1 is lagged behind the Z2 by about 90°, and the output FD_F of the frequency detector 30 has the low value. In this case, the state of the frequency detector 30 is changed in the order of I→IV→III→II, and this means that the state of the frequency detector 30 rotates in the counter-clockwise direction in the state diagram of FIG. 3C.

Meanwhile, in the case where the frequency $f_{CK}$ of the clock signal is higher than the data rate $f_{DATA}$, when the values of Z1 and Z2 of the frequency detector 30 are illustrated in sequence, signals in the form of a clock shown in FIG. 3E are obtained. Referring to FIG. 3E, the Z1 leads the Z2 by about 90°, and the output FD_F of the frequency detector 30 has the high value. In this case, the state of the frequency detector 30 is changed in the order of I→II→III→IV, and this means that the state of the frequency detector 30 rotates in the clockwise direction in the state diagram of FIG. 3C.

Figure 3F:
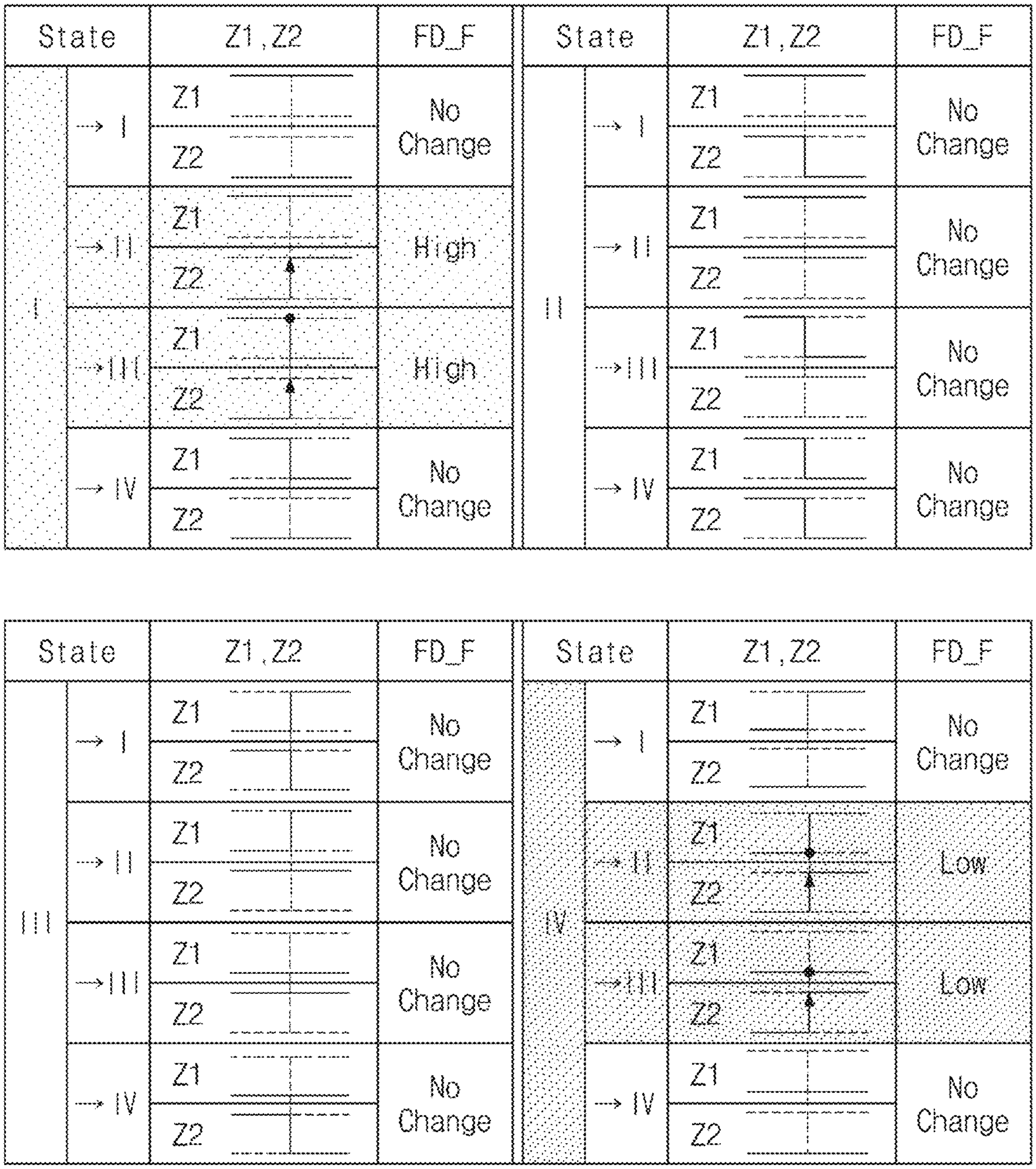
FIG. 3F is a table illustrating an output according to a change in state of the frequency detector of FIG. 3A.

FIG. 3F is a table illustrating an output of the frequency detector of FIG. 3A according to the change in state of the frequency detector of FIG. 3A.

Referring to FIG. 3A, the flip-flop 33 receives the signal Z1 via a data input terminal D and receives the signal Z2 via a clock input terminal ▷. Accordingly, the flip-flop 33 samples the signal Z1 at a rising edge of the signal Z2 and outputs the output signal FD_F.

As described above, since the state of the frequency detector 30, i.e., the values of (Z1, Z2), is changed depending on the frequency relationship between the clock signal and the data signal, the output signal FD_F is changed depending on the change of the state of the frequency detector 30. FIG. 3F shows the change of the output signal FD_F with respect to all possible state changes.

Referring to FIG. 3F, in both cases when the state of the frequency detector 30 is changed from I to II or from I to III, the output signal FD_F has the high value, and in both cases when the state of the frequency detector 30 is changed from IV to III or from IV to II, the output signal FD_F has the low value.

Hereinafter, a limitation of the range of frequency detection of the frequency detector 30 will be described with reference to FIGS. 3G to 3I.

Figure 3G:
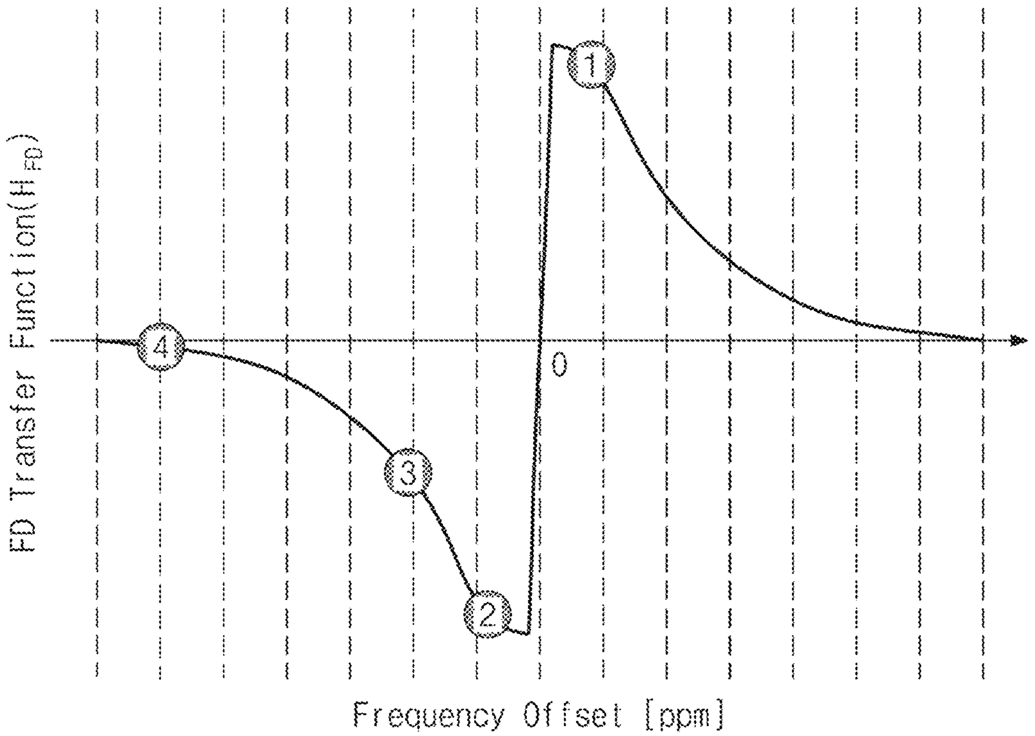
FIG. 3G is a graph illustrating a transfer function of the frequency detector of FIG. 3A.

FIG. 3G is a graph illustrating a transfer function of the frequency detector of FIG. 3A. In FIG. 3G, a frequency offset represents the difference between the frequency of the clock signal and the data rate of the data signal, and an FD Transfer Function (HFD) represents an average value of the output of the frequency detector 30. Meanwhile, among four points shown in FIG. 3G, ① indicates the case where the frequency of the clock signal is higher than the data rate, and ②, ③, and ④) indicate the case where the frequency of the clock signal is lower than the data rate.

Figure 3H:
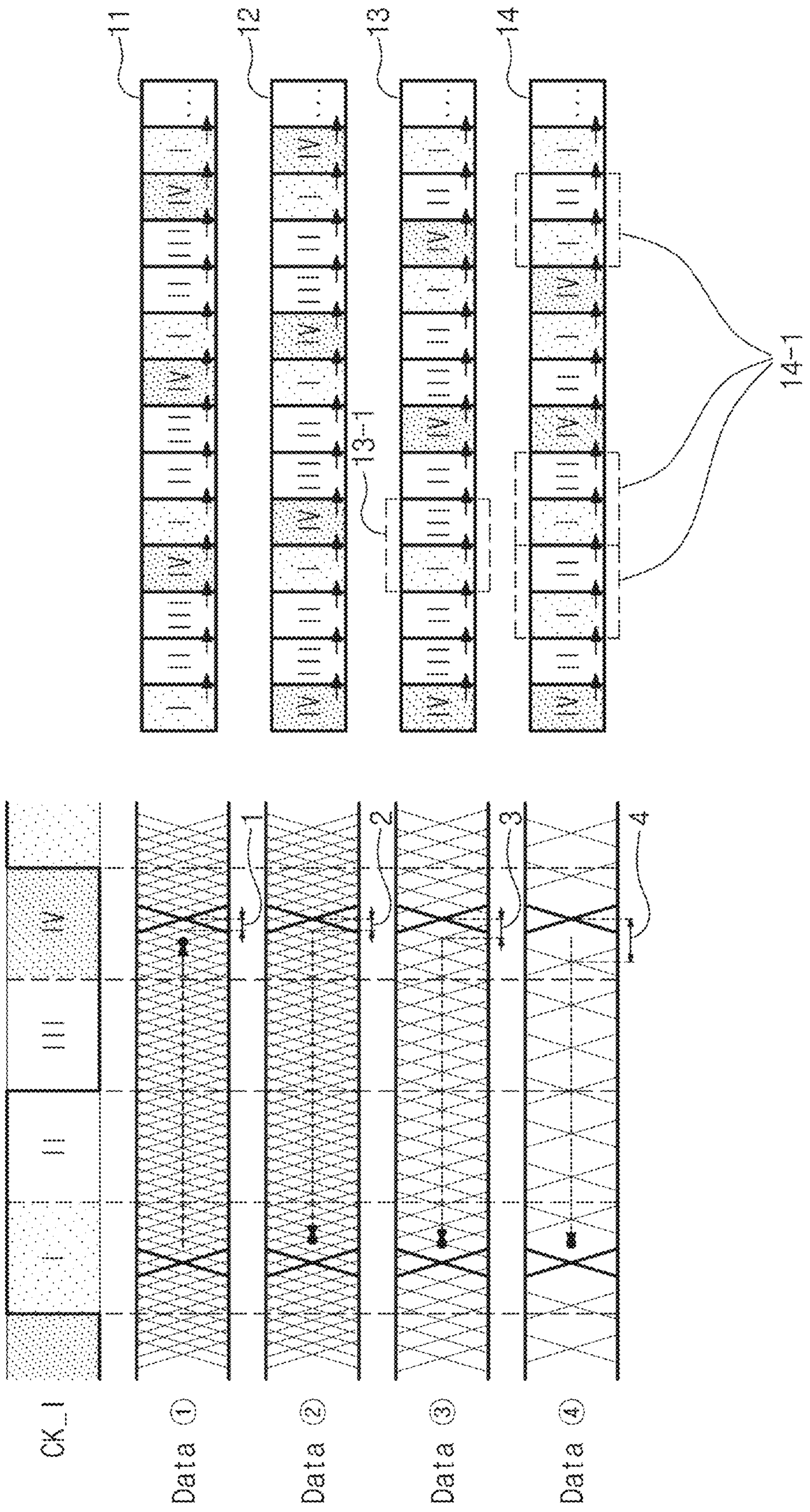
FIG. 3H is a view illustrating an operation of the frequency detector of FIG. 3A according to a frequency offset level.

FIG. 3H is a view illustrating the change of the state of the frequency detector 30 at the four points ① to ④ shown in FIG. 3G. In FIG. 3H, Data ①, Data ②, Data ③, and Data ④ respectively correspond to the points ①, ②, ③, and ④ of FIG. 3G, and reference numerals 11, 12, 13, and 14 indicate the change of the state in Data ①, Data ②, Data ③, and Data ④ respectively.

Referring to FIG. 3H, in the case where the frequency offset of the clock signal and the data signal is very small as represented by Data ① and Data ②, the state is sequentially changed one by one since the amount of changes (1, 2) of the phase of the data signal with respect to the clock signal per time is relatively very small.

That is, in the case of Data ①, the state is changed in the order of "I→II→III→IV→I . . . " as represented by the reference numeral 11. In this case, a pattern where the state is changed from I to II is always present, and a pattern where the state is changed from IV to III or from IV to II is rarely observed. As described with reference to FIG. 3F, since the output signal FD_F has the high value in the case where the state is changed from I to II, the output signal FD_F of the frequency detector 30 always has the high value in the case of Data ①. Meanwhile, in the case of Data ②, the state is changed in the order of "IV→III→II→I→IV . . . " as represented by the reference numeral 12. In this case, a pattern where the state is changed from IV to III is always present, and a pattern where the state is changed from I to II or from I to III is rarely observed. Accordingly, the output signal FD_F of the frequency detector 30 always has the low value. This means that the polarity of the output signal FD_F according to the frequency difference between the clock signal CK_I and the data signal DATA is always or almost always properly output.

Meanwhile, when the frequency offset of the clock signal and the data signal increases, a relative change in phase of the data signal and the clock signal increases. As an example, the point ③ of FIG. 3G shows a case in which an absolute value of the frequency offset increases because the frequency of the clock signal is lower than that in the point ②. Referring to FIG. 3H, the phase change (3) of Data ③ is increased compared with the phase changes (1, 2) of Data ① and Data ②.

In this case, the state is changed sequentially, but skips a sequence of the state changes occasionally. That is, since a transition density of data is not 1, a case where the state skips IV and is changed from I to III (13-1) occurs as indicated by the reference numeral 13. Accordingly, even though the frequency of the clock signal CK_I is lower than the frequency of the data signal DATA, the output signal FD_F of the frequency detector 30 often has the high value.

This causes a decrease of an absolute value of the transfer function as shown at the point ③ of FIG. 3G, however, it is determined that the frequency of the clock signal CK_I is lower than the frequency of the data signal DATA because the average value of the output signal FD_F of the frequency detector 30 is still close to the low value. Accordingly, the frequency offset ③ may still be included in the valid frequency detection range of the frequency detector 30.

Meanwhile, when the frequency offset becomes much smaller than 0 and becomes the case of point ④, the relative change in phase (4) of the data signal and the clock signal further increases as represented by Data ④. Accordingly, as a randomness of the state changes increases, the number of times at which the state is changed from I to II or from I to III increases as indicated by the reference numeral 14-1.

In this case, since the in-phase clock signal CK_I and the quadrature-phase clock signal CK_Q always have the phase difference of about 90°, a probability that the state is the first state (I) is the same as a probability that the state is the fourth state (IV) regardless of the frequency of the clock signal. Accordingly, as the randomness of the state change increases, the probability that the output signal FD_F has the low value and the probability that the output signal FD_F has the high value are the same as each other, and the transfer function value of the frequency detector 30 converges to zero (0).

The fact that the transfer function value, that is, the average value of the output FD_F of the frequency detector 30, converges to zero (0) means that it is difficult (or, alternatively, impossible) to determine whether the frequency of the clock signal CK_I is higher or lower than the frequency of the data signal, and thus, the operating range of the frequency detector 30 is limited at the frequency offset ④.

Figure 3I:
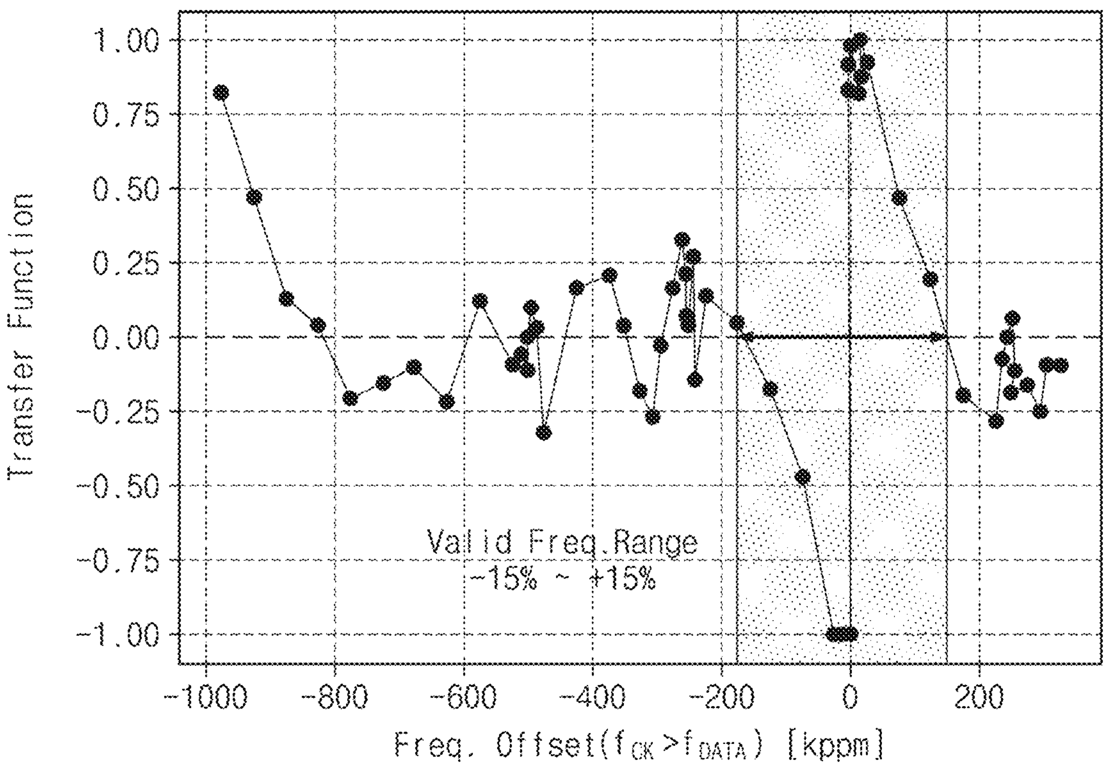
FIG. 3I is a graph illustrating a transfer function of the frequency detector of FIG. 3A.

FIG. 3I is a graph illustrating the transfer function of the conventional frequency detector 30 of FIG. 3A.

Referring to FIG. 3I, the transfer function value of the frequency detector 30 is shown in a frequency offset range of about −1000 [kppm] to about 400 [kppm]. In this case, the transfer function value means the average value when a case where the output signal FD_F of the frequency detector 30 is high is defined as "1" and a case where the output signal FD_F of the frequency detector 30 is low is defined as "−1". Referring to FIG. 3I, in the case of the conventional frequency detector 30, the valid frequency detection range is limited to a range of about −15% to about +15% based on the data rate.

As described above, since the probability that the state is the first state (I) is the same as the probability that the state is the fourth state (IV) in the conventional frequency detector 30, the transfer function value converges to zero (0) when the frequency offset is equal to or greater than the predetermined value, and the frequency detection range is limited.

According to the embodiments of the present disclosure, even though the frequency offset is large, for example, even in the case of ④ in FIG. 3G, the frequency detector 30 outputs the low values more by allowing the probability of being in the fourth state (IV) to be higher than the probability of being in the first state (I), and thus, the frequency detection range of the frequency detector may extend.

Hereinafter, various embodiments of the present disclosure will be described with reference to FIGS. 4A to 9B. In the descriptions with reference to FIGS. 3A to 3I, the contents that are not inconsistent with the present disclosure may be applied to various embodiments of the present disclosure.

Figure 4A:
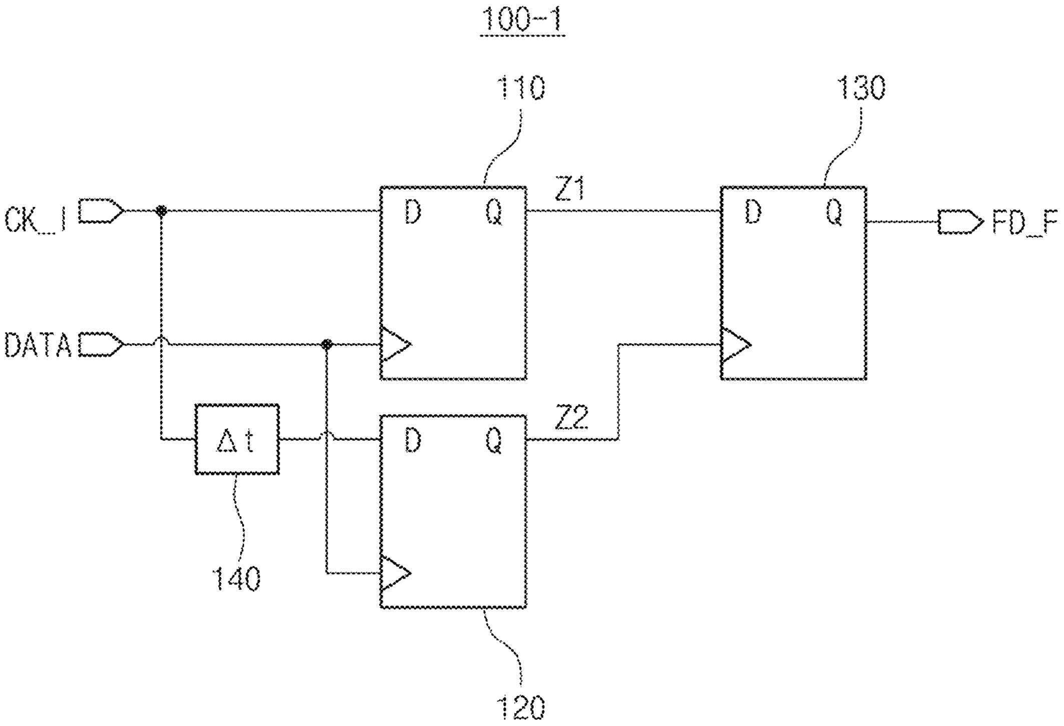
FIG. 4A is a circuit diagram illustrating a frequency detector according to an example embodiment of the present disclosure.

FIG. 4A is a circuit diagram illustrating a frequency detector 100-1 according to an example embodiment of the present disclosure.

Referring to FIG. 4A, the frequency detector 100-1 may include a first flip-flop 110, a second flip-flop 120, a third flip-flop 130, and a delay cell 140.

In this case, each of the first, second, and third flip-flops 110, 120, and 130 may be a D flip-flop as shown in FIG. 4A, however, it should not be limited thereto or thereby.

The first flip-flop 110 may sample a clock signal CK_I based on a data signal DATA to generate a first signal Z1. In detail, the first flip-flop 110 may be the D flip-flop, may receive the clock signal CK_I via a data input terminal D thereof, and may receive the data signal DATA via a clock input terminal ▷ thereof, and thus, the first signal Z1 may have a value of the clock signal CK_I corresponding to a rising edge of the data signal DATA.

The second flip-flop 120 may sample a delayed-phase component CK_I+Δt of the clock signal CK_I based on the data signal DATA to generate a second signal Z2. In detail, the second flip-flop 120 may be the D flip-flop, may receive the delayed-phase component CK_I+Δt of the clock signal via a data input terminal D thereof, and may receive the data signal DATA via a clock input terminal ▷ thereof, and thus, the second signal Z2 may have a value of the delayed-phase component CK_I+Δt of the clock signal corresponding to the rising edge of the data signal DATA. In this case, the delayed-phase component CK_I+Δt of the clock signal may be a clock signal whose phase is delayed by a delay amount Δt by the delay cell 140 with respect to a phase of the clock signal CK_I.

The delay cell 140 may be used to change a phase of an input signal and may be implemented by various well-known delay circuits or delay buffers. Referring to FIG. 4A, the delay cell 140 may delay the phase of the clock signal CK_I input thereinto by the desired (or, alternatively, the predetermined) amount Δt, may generate the delayed-phase component CK_I+Δt of the clock signal, and may provide the delayed-phase component CK_I+Δt of the clock signal to the data input terminal D of the second flip-flop 120.

In this case, the delay amount Δt delayed by the delay cell 140 may have a value set within a desired (or, alternatively, a predetermined) range smaller than about 0.25 UI. According to an example embodiment, the desired (or, alternatively, the predetermined) range may be from about 0.1 UI to about 0.15 UI, however, it should not be limited thereto or thereby. As an example, when the delay amount Δt set by the delay cell 140 is about 0.125 UI, the delay cell 140 may apply the set delay amount Δt to the clock signal CK_I and may generate the clock signal CK_I+Δt whose phase is delayed by about 0.125 UI.

The third flip-flop 130 may sample the first signal Z1 based on the second signal Z2 to generate a third signal FD_F. In detail, the third flip-flop 130 may be the D flip-flop, may receive the first signal Z1 via a data input terminal D thereof, and may receive the second signal Z2 via a clock input terminal ▷ thereof, and thus, the third signal FD_F may have a value of the first signal Z1 corresponding to a rising edge of the second signal Z2.

In this case, the frequency detector 100-1 may have four states according to the value of the first signal Z1 and the value of the second signal Z2, a case where (Z1, Z2) is (1, 0) may be defined as a first state (I), a case where (Z1, Z2) is (1, 1) may be defined as a second state (II), a case where (Z1, Z2) is (0, 1) may be defined as a third state (III), and a case where (Z1, Z2) is (0, 0) may be defined as a fourth state (IV).

Meanwhile, when a difference exists between a frequency $f_{CK}$ of the clock signal and a data rate $f_{DATA}$, the state of the frequency detector 100-1 may be changed between the four states. This is as described above with reference to FIGS. 3B and 3C. In addition, the third signal FD_F may have a high value when the state of the frequency detector 100-1 is changed from the first state (I) to the second state (II) or the third state (III) and may have a low value when the state of the frequency detector 100-1 is changed from the fourth state (IV) to the second state (II) or the third state (III), and this is as described above with reference to FIG. 3F.

When comparing the frequency detector 100-1 of FIG. 4A with the frequency detector 30 of FIG. 3A, the delayed-phase component CK_I+Δt of the clock signal is used as the input to the data input terminal D of the second flip-flop 120 instead of the quadrature-phase clock signal CK_Q.

The in-phase clock signal CK_I and the quadrature-phase clock signal CK_Q, which are used in the frequency detector 30 of FIG. 3A, have the phase difference of about 90°, and when the phase difference of about 90° is converted into the data UI, it becomes about 0.25 UI. In this case, since the probability that the state is the first state (I) is equal to the probability that the state is the fourth state (IV) as described above, the frequency detection range is limited.

However, according to the frequency detector 100-1 of FIG. 4A, since the clock signal CK_I and the delayed-phase component CK_I+Δt of the clock signal have the phase difference of Δt and a value smaller than about 0.25 UI is used as the value of Δt, the probability that the state is the first state (I) may be different from the probability that the state is the fourth state (IV).

Figure 4B:
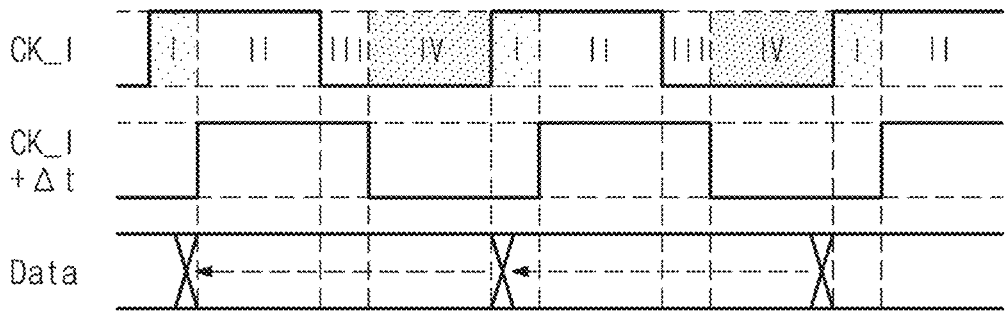
FIG. 4B is a view illustrating a state model of the frequency detector of FIG. 4A.
Figure 4C:
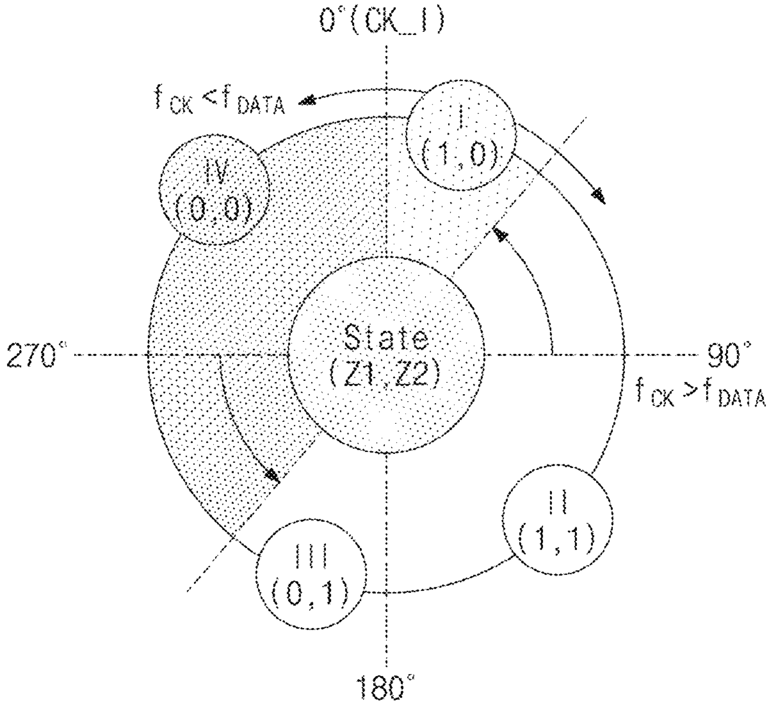
FIG. 4C is a state diagram illustrating the frequency detector of FIG. 4A.

FIGS. 4B and 4C are views illustrating a state model and a state diagram according to the first signal Z1 and the second signal Z2 of the frequency detector 100-1.

When comparing the state model of FIG. 4B with the state model of FIG. 3B, a width of the first state (I) and the third state (III) may decrease based on the phase of the clock signal CK_I, and a width of the second state (II) and the fourth state (IV) may increase based on the phase of the clock signal CK_I. Accordingly, the probability that the state is the fourth state (IV) may be greater than the probability that the state is the first state (I) in the frequency detector 100-1. This may be observed in the state diagram of FIG. 4C.

Meanwhile, the delay amount Δt by the delay cell 140 may be a fixed value. Accordingly, when the frequency of the clock signal decreases, the probability that the state is the first state (I) may further decrease, and the probability that the state is the fourth state (IV) may further increase. That is, as the frequency $f_{CK}$ of the clock signal becomes lower than the data rate $f_{DATA}$, the probability that the state of the frequency detector 100-1 is the first state (I) may decrease, and the probability that the state of the frequency detector 100-1 is the fourth state (IV) may increase.

Consequently, according to the frequency detector 100-1 of FIG. 4A, even though the randomness of state changes increases due to the frequency offset that becomes smaller than zero (0), the number of times at which the state of the frequency detector 100-1 is changed from the state (IV) to the state (III) or from the state (IV) to the state (II) increases because the probability that the state is the fourth state (IV) also increases. In this case, a probability that the output signal FD_F has a low value is greater than a probability that the output signal FD_F has a high value, and thus, a transfer function value may be smaller than zero (0). Accordingly, a valid frequency detection may be possible in almost all frequency offset ranges where the frequency of the clock signal CK_I is lower than the frequency of the data signal DATA.

Figure 4D:
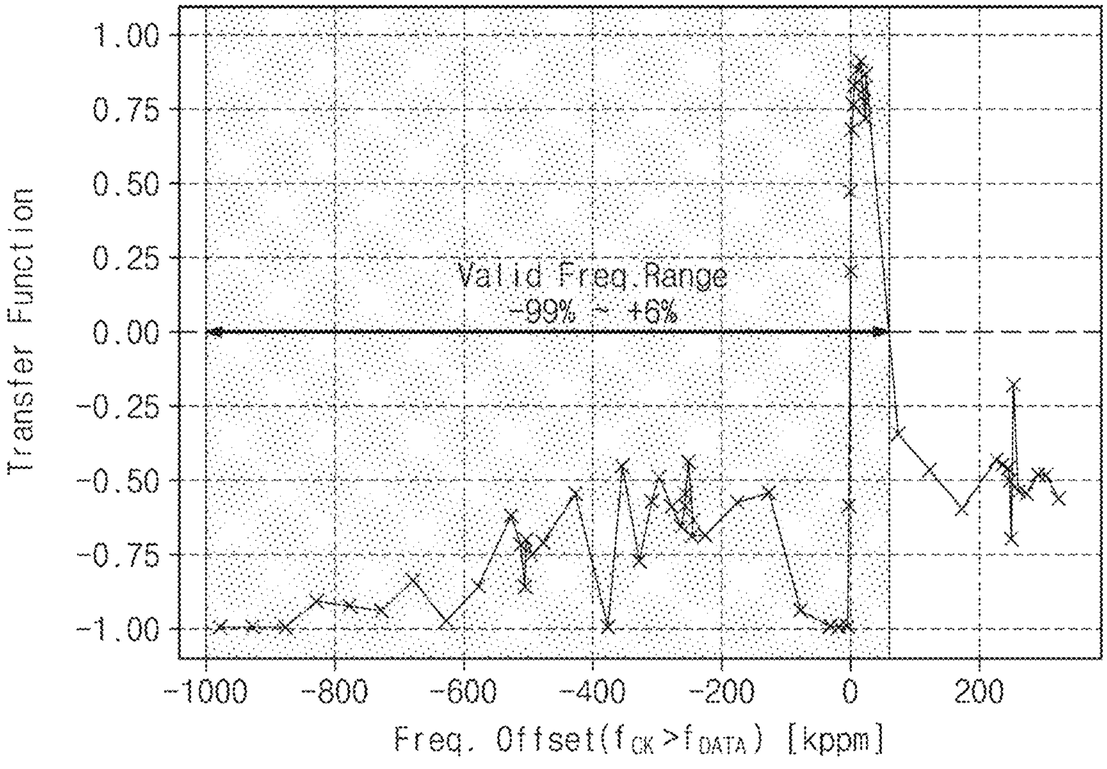
FIG. 4D is a graph illustrating a transfer function of the frequency detector of FIG. 4A.

FIG. 4D is a graph illustrating the transfer function of the frequency detector 100-1 of FIG. 4A. For convenience of comparison, FIG. 4D shows the transfer function value of the frequency detector 100-1 in the same frequency offset range as that in FIG. 3I. Referring to FIG. 4, it is observed that the valid frequency detection range extends to a range of about −99% to about +6% based on the data rate, however, this is merely an example. The frequency detection range should not be limited to thereto or thereby and may be changed depending on embodiments.

Figure 5:
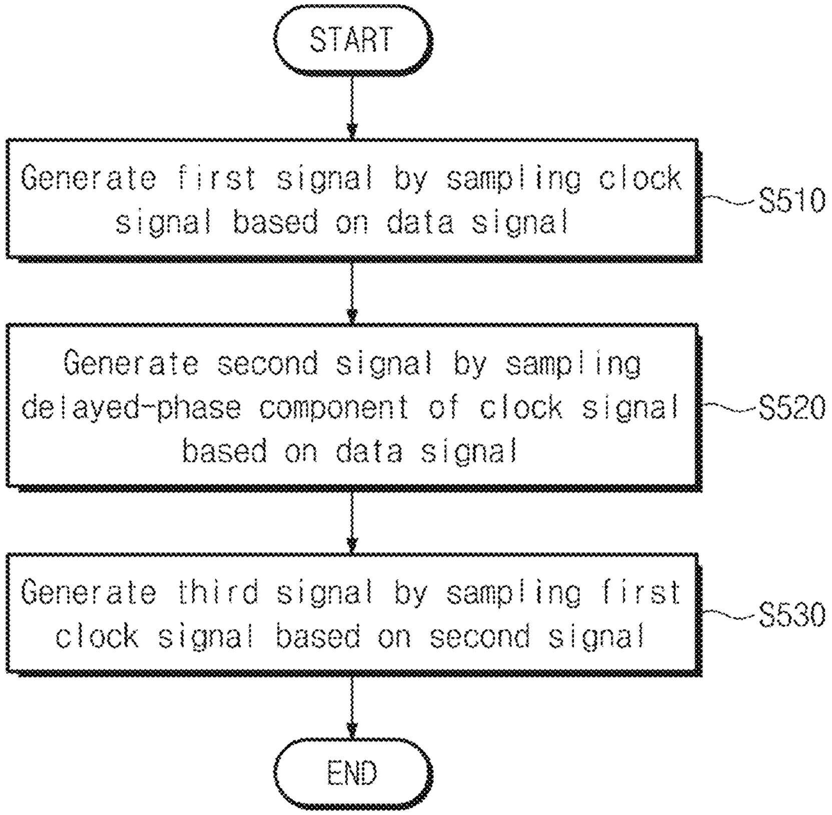
FIG. 5 is a flowchart illustrating a method of operating a frequency detector according to an example embodiment of the present disclosure.

FIG. 5 is a flowchart illustrating a method of operating the frequency detector 100-1 according to an embodiment of the present disclosure.

Referring to FIG. 5, in operation S510, when the clock signal CK_I and the data signal DATA are input, the frequency detector 100-1 may sample the clock signal CK_I based on the data signal DATA to generate the first signal Z1.

In addition, when the clock signal CK_I and the data signal DATA are input, in operation S520, the frequency detector 100-1 may sample the delayed-phase component CK_I+Δt of the clock signal based on the data signal DATA to generate the second signal Z2. In detail, the frequency detector 100-1 may generate the delayed-phase component CK_I+Δt of the clock signal when the clock signal CK_I is input and may sample the generated delayed-phase component CK_I+Δt of the clock signal based on the data signal DATA to generate the second signal Z2. In some example embodiments, operations S510 and S520 may occur simultaneously. However, example embodiments are not limited thereto.

In operation S530, the frequency detector 100-1 may sample the first signal Z1 based on the second signal Z2 to generate the third signal FD_F that represents a polarity of the frequency difference between the data rate $f_{DATA}$ of the data signal and the frequency $f_{CK}$ of the clock signal.

Meanwhile, the third signal FD_F may be applied to a control circuit that controls an operation of an oscillator, and the control circuit may control the operation of the oscillator to change the frequency of the clock signal based on an average value of the third signal FD_F.

When the clock signal having the changed frequency is provided from the oscillator, the frequency detector 100-1 may repeat the operations S510 to S530 based on the clock signal having the changed frequency and the data signal.

Since the data rate of the data signal is constant, the data rate may be detected by detecting the frequency of the clock signal, which corresponds to the data rate, through the above-described operations.

Figure 6A:
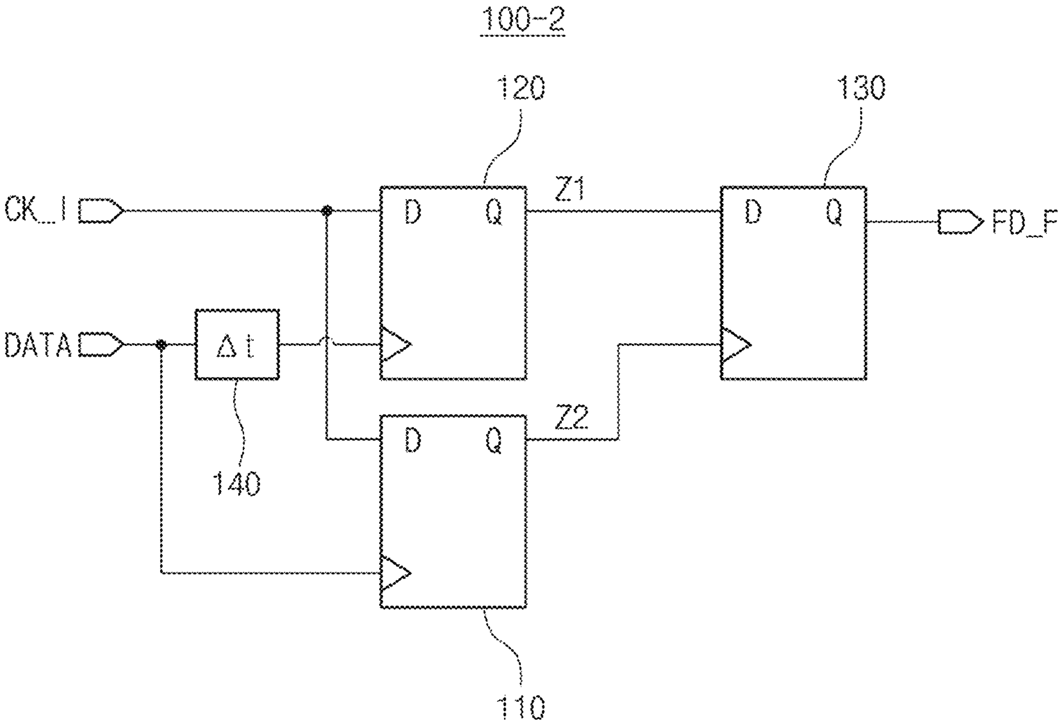
FIG. 6A is a circuit diagram illustrating a frequency detector according to an example embodiment of the present disclosure.

FIG. 6A is a circuit diagram illustrating a frequency detector 100-2 according to an example embodiment of the present disclosure.

Referring to FIG. 6A, the frequency detector 100-2 may include a first flip-flop 110, a second flip-flop 120, a third flip-flop 130, and a delay cell 140.

Each of the first, second, and third flip-flops 110, 120, and 130 may be a D flip-flop as shown in FIG. 6A, however, it should not be limited thereto or thereby.

The first flip-flop 110 may sample a clock signal CK_I based on a data signal DATA to generate a first signal Z2. In detail, the first flip-flop 110 may be the D flip-flop, may receive the clock signal CK_I via a data input terminal D thereof, and may receive the data signal DATA via a clock input terminal ▷ thereof, and thus, the first signal Z2 may have a value of the clock signal CK_I corresponding to a rising edge of the data signal DATA.

The second flip-flop 120 may sample the clock signal CK_I based on a delayed-phase component DATA+Δt of the data signal to generate a second signal Z1. In detail, the second flip-flop 120 may be the D flip-flop, may receive the clock signal CK_I via a data input terminal D thereof, and may receive the delayed-phase component DATA+Δt of the data signal via a clock input terminal ▷ thereof, and thus, the second signal Z1 may have a value of the clock signal CK_I corresponding to a rising edge of the delayed-phase component DATA+Δt of the data signal. In this case, the delayed-phase component DATA+Δt of the data signal may be a clock signal whose phase is delayed by a delay amount Δt by the delay cell 140 based on a phase of the data signal DATA.

The delay cell 140 may be used to change a phase of an input signal and may be implemented by various well-known delay circuits or delay buffers. Referring to FIG. 6A, the delay cell 140 may delay the phase of the data signal DATA input thereinto by the desired (or, alternatively, the predetermined) amount Δt, may generate the delayed-phase component DATA+Δt of the data signal, and may provide the delayed-phase component DATA+Δt of the data signal to the clock input terminal ▷ of the second flip-flop 120.

In this case, the delay amount Δt delayed by the delay cell 140 may have a value set within a desired (or, alternatively, a predetermined) range smaller than about 0.25 UI. According to an embodiment, the desired (or, alternatively, the predetermined) range may be from about 0.1 UI to about 0.15 UI, however, it should not be limited thereto or thereby. As an example, when the delay amount Δt set by the delay cell 140 is about 0.125 UI, the delay cell 140 may apply the set delay amount Δt to the data signal DATA and may generate the delayed-phase component DATA+Δt of the data signal whose phase is delayed by about 0.125 UI.

The third flip-flop 130 may sample the second signal Z1 based on the first signal Z2 to generate a third signal FD_F. In detail, the third flip-flop 130 may be the D flip-flop, may receive the second signal Z1 via a data input terminal D thereof, and may receive the first signal Z2 via a clock input terminal ▷ thereof, and thus, the third signal FD_F may have a value of the second signal Z1 corresponding to a rising edge of the first signal Z2.

In this case, the frequency detector 100-2 may have four states according to the value of the first signal Z2 and the value of the second signal Z1, a case where (Z1, Z2) is (1, 0) may be defined as a first state (I), a case where (Z1, Z2) is (1, 1) may be defined as a second state (II), a case where (Z1, Z2) is (0, 1) may be defined as a third state (III), and a case where (Z1, Z2) is (0, 0) may be defined as a fourth state (IV).

Meanwhile, when a difference exists between a frequency $f_{CK}$ of the clock signal and a data rate $f_{DATA}$, the state of the frequency detector 100-2 may be changed between the four states. This is as described above with reference to FIGS. 3B and 3C. In addition, the third signal FD_F may have a high value when the state of the frequency detector 100-2 is changed from the first state (I) to the second state (II) or the third state (III) and may have a low value when the state of the frequency detector 100-2 is changed from the fourth state (IV) to the second state (II) or the third state (III), and this is as described above with reference to FIG. 3F.

When comparing the frequency detector 100-2 of FIG. 6A with the frequency detector 30 of FIG. 3A, the delayed-phase component DATA+Δt of the data signal may be used as the input to the clock input terminal ▷ of the second flip-flop 120, which outputs the signal Z1, instead of the data signal DATA, and the clock signal CK_I may be used as the input to the data input terminal D of the first flip-flop 110, which outputs the signal Z2, instead of the quadrature-phase clock signal CK_Q.

The in-phase clock signal CK_I and the quadrature-phase clock signal CK_Q, which are used in the frequency detector 30 of FIG. 3A, have the phase difference of about 90°, and when the phase difference of about 90° is converted into the data UI, it becomes about 0.25 UI. In this case, since the probability that the state is the first state (I) is equal to the probability that the state is the fourth state (IV) as described above, the frequency detection range is limited.

However, according to the frequency detector 100-2 of FIG. 6A, since the data signal DATA and the delayed-phase component DATA+Δt of the data signal may have the phase difference of a value of Δt and a value smaller than about 0.25 UI may be used as the value of Δt, the probability that the state is the first state (I) may be different from the probability that the state is the fourth state (IV).

Figure 6B:
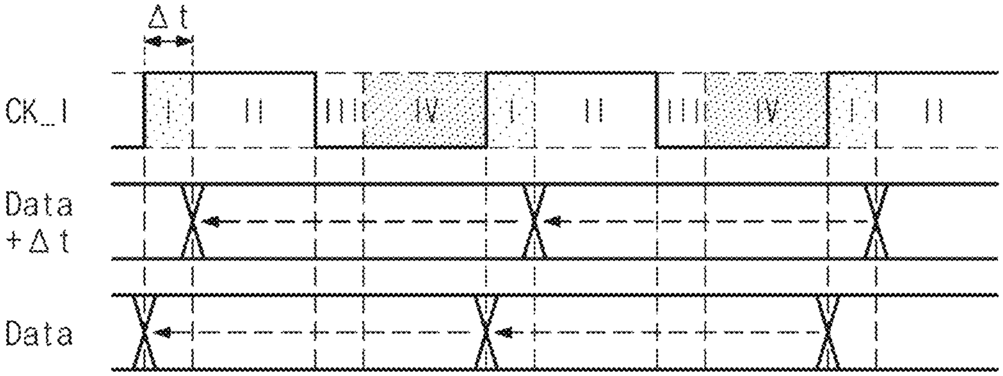
FIG. 6B is a view illustrating a state model of the frequency detector of FIG. 6A.
Figure 6C:
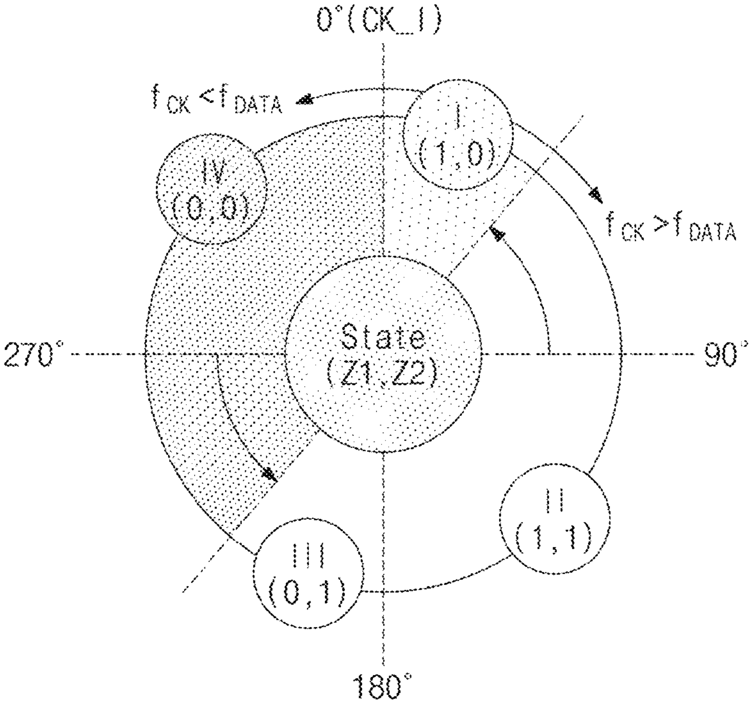
FIG. 6C is a state diagram illustrating the frequency detector of FIG. 6A.

FIGS. 6B and 6C are views illustrating a state model and a state diagram according to the second signal Z1 and the first signal Z2 of the frequency detector 100-2.

FIG. 6B shows the state model according to the second signal Z1 and the first signal Z2. Referring to FIG. 6B, the state of the frequency detector 100-2 may be determined according to a phase relationship between the delayed-phase component DATA+Δt of the data signal and the clock signal CK_I.

In detail, referring to the state model of FIG. 6B, the state of the frequency detector 100-2 may be the first state (I) when the rising edge of the delayed-phase component DATA+Δt of the data signal is located between 0° and Δt of the clock signal CK_I. Similarly, when the rising edge of the delayed-phase component DATA+Δt of the data signal is located between Δt and 180°, between 180° and 180°+Δt, and between 180°+Δt and 360° of the clock signal CK_I, the state of the frequency detector 100-2 may be the second state (II), the third state (III), and the fourth state (IV), respectively.

When comparing the state model of FIG. 6B with the state model of FIG. 3B, a width of the first state (I) and the third state (III) may decrease based on the phase of the clock signal CK_I, and a width of the second state (II) and the fourth state (IV) may increase based on the phase of the clock signal CK_I. Accordingly, the probability that the state is the fourth state (IV) may be greater than the probability that the state is the first state (I) in the frequency detector 100-2. This may be observed in the state diagram of FIG. 6C.

Meanwhile, the delay amount Δt by the delay cell 140 may be a fixed value. Accordingly, when the frequency of the clock signal decreases, the probability that the state is the first state (I) may further decrease, and the probability that the state is the fourth state (IV) may further increase. That is, as the frequency $f_{CK}$ of the clock signal is lower than the data rate $f_{DATA}$, the probability that the state of the frequency detector 100-2 is the first state (I) may decrease, and the probability that the state of the frequency detector 100-2 is the fourth state (IV) may increase.

Consequently, according to the frequency detector 100-2 of FIG. 6A, even though the randomness of state changes increases due to the frequency offset that becomes smaller than zero (0), the number of times at which the state of the frequency detector 100-2 is changed from the state (IV) to the state (III) or from the state (IV) to the state (II) increases because the probability that the state is the fourth state (IV) also increases. In this case, a probability that the output signal FD_F has a low value may be greater than a probability the output signal FD_F has a high value, and thus, a transfer function value may be smaller than zero (0). Accordingly, a valid frequency detection may be possible in almost all frequency offset ranges where the frequency of the clock signal CK_I is lower than the frequency of the data signal DATA.

Meanwhile, a transfer function of the frequency detector 100-2 of FIG. 6A is the same as that of the frequency detector 100-1 of FIG. 4D, and thus, descriptions of the transfer function of the frequency detector 100-2 are omitted.

Figure 7:
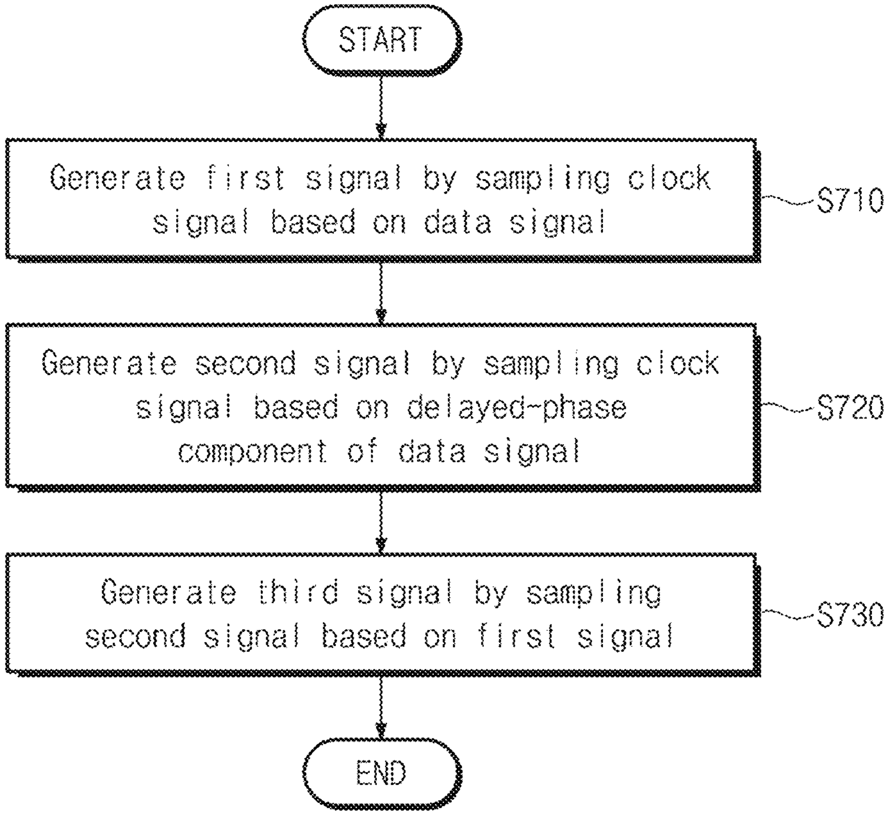
FIG. 7 is a flowchart illustrating a method of operating a frequency detector according to an example embodiment of the present disclosure.

FIG. 7 is a flowchart illustrating a method of operating the frequency detector 100-2 according to an embodiment of the present disclosure.

Referring to FIG. 7, in operation S710, when the clock signal CK_I and the data signal DATA are input, the frequency detector 100-2 may sample the clock signal CK_I based on the data signal DATA to generate the first signal Z2.

In addition, when the clock signal CK_I and the data signal DATA are input, in operation S720, the frequency detector 100-2 may sample the clock signal CK_I based on the delayed-phase component DATA+Δt of the data signal to generate the second signal Z1. In detail, when the data signal DATA is input, the frequency detector 100-2 may generate the delayed-phase component DATA+Δt of the data signal and may sample the clock signal CK_I based on the generated delayed-phase component DATA+Δt of the data signal to generate the second signal Z1. In some example embodiments, operations S710 and S720 may occur simultaneously. However, example embodiments are not limited thereto.

In operation S730, the frequency detector 100-2 may sample the second signal Z1 based on the first signal Z2 to generate the third signal FD_F that represents the polarity of the frequency difference between the data rate $f_{DATA}$ of the data signal and the frequency $f_{CK}$ of the clock signal.

Meanwhile, the third signal FD_F may be applied to a control circuit that controls an operation of an oscillator, and the control circuit may control the operation of the oscillator to change the frequency of the clock signal based on an average value of the third signal FD_F.

When the clock signal having the changed frequency is provided from the oscillator, the frequency detector 100-2 may repeat the operations S710 to S730 based on the clock signal having the changed frequency and the data signal.

Since the data rate of the data signal is constant, the data rate may be detected by detecting the frequency of the clock signal, which corresponds to the data rate, through the above-described operations.

Figure 8:
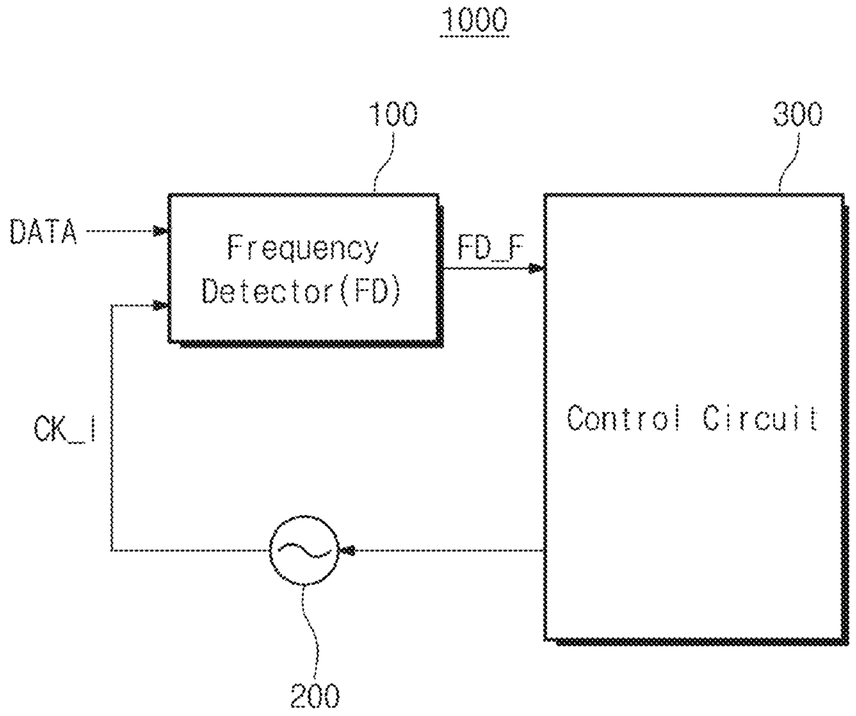
FIG. 8 is a block diagram illustrating a system including a frequency detector according to an example embodiment of the present disclosure.

FIG. 8 is a block diagram illustrating a frequency detection system 1000 including a frequency detector 100 according to an example embodiment of the present disclosure.

Referring to FIG. 8, the frequency detection system 1000 may include the frequency detector 100, an oscillator 200, and a control circuit 300.

As described above, the frequency detector 100 may receive the data signal DATA and the clock signal CK_I, may generate the third signal FD_F representing the polarity of the frequency difference between the data signal and the clock signal, and may provide the generated third signal FD_F to the control circuit 300.

The oscillator 200 may provide the clock signal CK_I to the frequency detector 100. In addition, the oscillator 200 may change the frequency of the clock signal CK_I under the control by the control circuit 300 and may provide the clock signal having the changed frequency to the frequency detector 100. As an example, the oscillator 200 may be, but not limited to, a voltage-controlled oscillator (VCO).

The control circuit 300 may provide the control signal to the oscillator 200 to change the frequency of the clock signal based on the third signal FD_F provided from the frequency detector 100. In detail, since the third signal FD_F is the signal representing the polarity of the frequency difference between the data signal and the clock signal, the third signal FD_F may have the low or high value. Accordingly, the control circuit 300 may generate the control signal based on the average value of the third signal FD_F.

As an example, it is assumed that the third signal FD_F has the low value (e.g., −1) when the frequency of the clock signal is low based on the data rate of the data signal and the third signal FD_F has the high value (e.g., +1) when the frequency of the clock signal is high based on the data rate of the data signal.

In this case, the control circuit 300 may provide the control signal required to increase the frequency of the clock signal to the oscillator 200 when the average value of the third signal FD_F is smaller than zero (0) and may provide the control signal required to decrease the frequency of the clock signal to the oscillator 200 when the average value of the third signal FD_F is greater than zero (0).

Meanwhile, in a case where the average value of the third signal FD_F is zero (0) or is within a margin of error, the control circuit 300 may not provide the control signal required to change the frequency to the oscillator 200. Accordingly, a current frequency of the oscillator 200 may be fixed.

In the case where the average value of the third signal FD_F is zero (0) or is included within the margin of error, a frequency of a current clock signal may coincide with the data rate or a difference between the frequency of the current clock signal and the data rate may be included within a margin of error even though the difference exists therebetween, and thus, the currently fixed frequency of the oscillator 200 may be detected as the data rate of the data signal.

As described above, when the data rate of the data signal is detected, the clock signal having the frequency corresponding to the detected data rate may be used to restore the data signal.

Meanwhile, as shown in FIGS. 4D and 6D, the valid frequency detection range of the frequency detector 100 may have the range from about −99% to about +6% based on the data rate.

According to the present disclosure, the frequency may be detected more reliably through a unidirectional frequency detection operation. The unidirectional frequency detection refers to a method of determining the frequency while gradually increasing the frequency of the clock signal from the low value to the high value.

In detail, the frequency of the clock signal provided to the frequency detector 100 by the oscillator 200 may gradually increase from the desired (or, alternatively, the predetermined) value to the high value, and in this case, the desired (or, alternatively, predetermined) value may have a relatively low frequency value.

In the above descriptions, various example embodiments of the present disclosure are described using the full-rate frequency detector as a representative example, but the present disclosure should not be limited thereto or thereby. As an example, the above-described various embodiments of the present disclosure may be applied to various frequency detectors, such as a half-rate frequency detector, a rotational frequency detector, a deadzone-compensated frequency detector (DCFD), and the like.

Figure 9A:
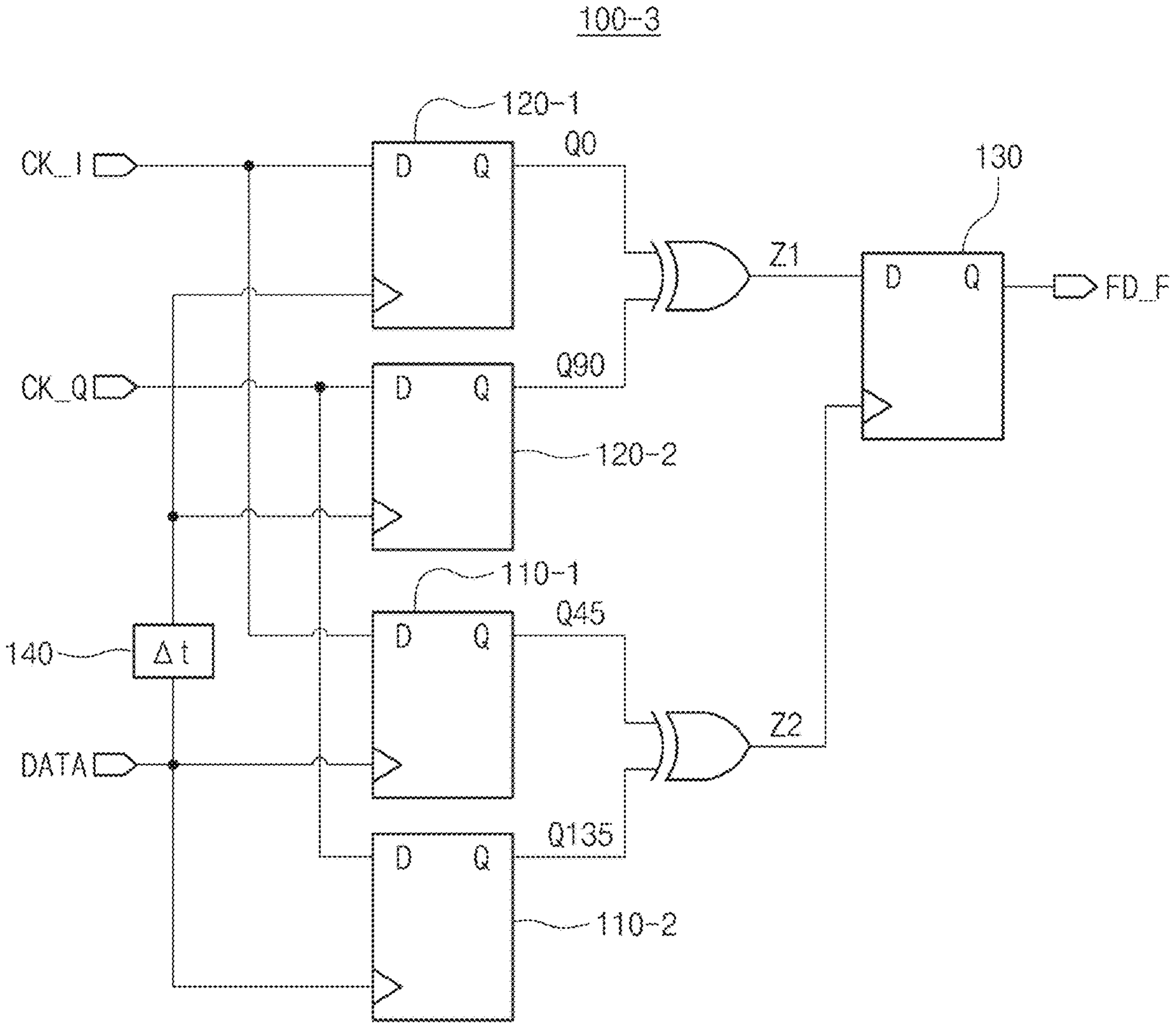
FIG. 9A is a circuit diagram illustrating a deadzone-compensated frequency detector according to an example embodiment of the present disclosure.

FIG. 9A is a circuit diagram illustrating a deadzone-compensated frequency detector 100-3 according to an example embodiment of the present disclosure.

Referring to FIG. 9A, the deadzone-compensated frequency detector 100-3 of FIG. 9A is a half-rate frequency detector. Accordingly, the deadzone-compensated frequency detector 100-3 of FIG. 9A may have substantially the same structure and function as those of the frequency detector 100-2 of FIG. 6A except that an in-phase clock signal CK_I and a quadrature-phase clock signal CK_Q are input as clock signals.

First, regarding an in-phase component, a flip-flop 110-1 may sample the in-phase clock signal CK_I based on a data signal DATA to generate a signal Q45, and a flip-flop 120-1 may sample the in-phase clock signal CK_I based on a delayed-phase component DATA+Δt of the data signal to generate a signal Q0.

Meanwhile, regarding a quadrature-phase component, a flip-flop 110-2 may sample the quadrature-phase clock signal CK_Q based on the data signal DATA to generate a signal Q135, and a flip-flop 120-2 may sample the quadrature-phase clock signal CK_Q based on the delayed-phase component DATA+Δt of the data signal to generate a signal Q90.

Accordingly, the signal Q0 and the signal Q90 may be output as a signal Z1 after passing through an OR gate, and the signal Z1 may be input to a data input terminal D of a flip-flop 130. In addition, the signal Q45 and the Q135 may be output as a signal Z2 after passing through an OR gate, and the signal Z2 may be input to a clock input terminal ▷ of the flip-flop 130.

Meanwhile, the delay cell 140 may receive the data signal DATA and may delay a phase of the data signal DATA by a desired (or, alternatively, a predetermined) amount Δt to generate the delayed-phase component DATA+Δt of the data signal. The delay cell 140 may provide the generated delayed-phase component DATA+Δt of the data signal to the clock input terminal ▷ of the flip-flop 120-1 and the flip-flop 120-2.

In this case, the delay amount Δt delayed by the delay cell 140 may have a value set within a desired (or, alternatively, a predetermined) range smaller than about 0.25 UI. According to an example embodiment, the desired (or, alternatively, the predetermined) range may be from about 0.1 UI to about 0.15 UI, however, it should not be limited thereto or thereby.

As an example, when the delay amount Δt set by the delay cell 140 is about 0.125 UI, the delay cell 140 may apply the set delay amount Δt to the data signal DATA and may generate the delayed-phase component DATA+Δt of the data signal, which is delayed by about 0.125 UI.

Meanwhile, the flip-flop 130 may sample the signal Z1 based on the signal Z2 to generate a third signal FD_F representing a polarity of a frequency difference between the data signal and the clock signal.

In this case, a probability that the state is the fourth state (IV) may be greater than a probability that the state is the first state (I), and as shown in FIG. 4D, the deadzone-compensated frequency detector 100-3 may have a frequency detection range wider than that of a conventional frequency detector.

Figure 9B:
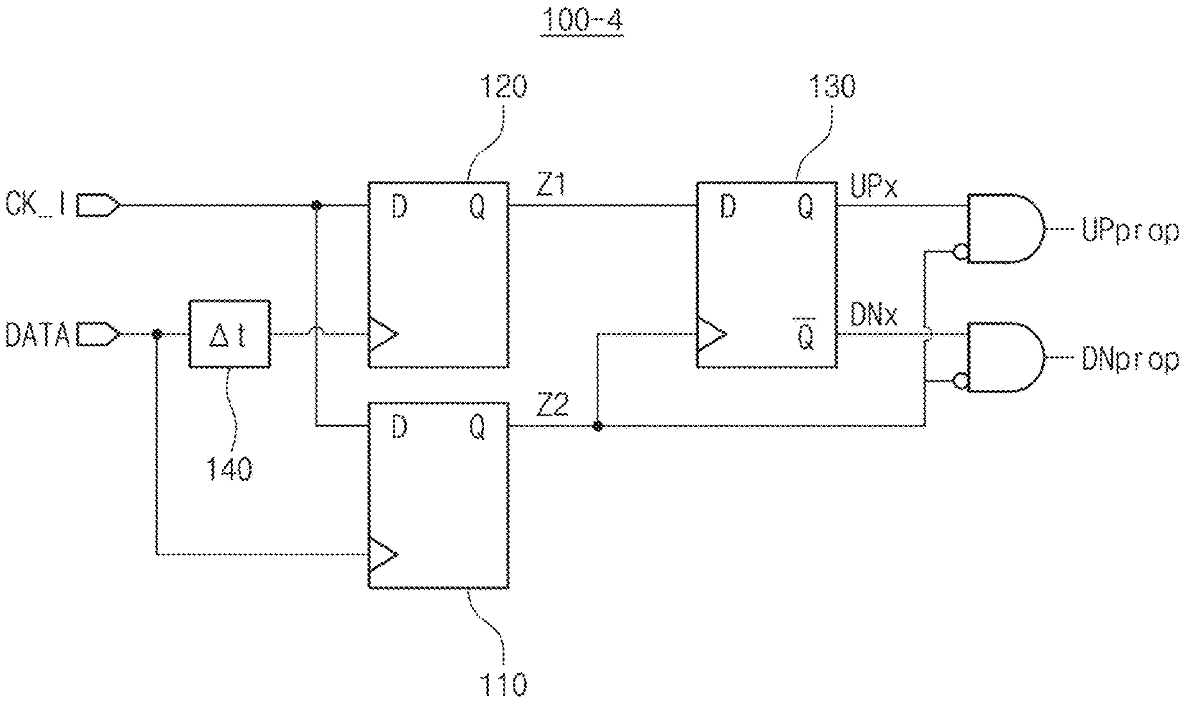
FIG. 9B is a circuit diagram illustrating a rotational frequency detector according to an example embodiment of the present disclosure.

FIG. 9B is a circuit diagram illustrating a rotational frequency detector 100-4 according to an example embodiment of the present disclosure.

Referring to FIG. 9B, the rotational frequency detector 100-4 may have substantially the same structure and function as those of the frequency detector 100-2 of FIG. 6A except a method of utilizing an output of a flip-flop 130.

In detail, a flip-flop 110 may sample a clock signal CK_I based on a data signal DATA to generate a signal Z2. In addition, a flip-flop 120 may sample the clock signal CK_I based on a delayed-phase component DATA+Δt of the data signal to generate a signal Z1.

A delay cell 140 may receive the data signal DATA, may delay a phase of the data signal DATA by a desired (or, alternatively, a predetermined) amount Δt to generate the delayed-phase component DATA+Δt of the data signal, and may provide the generated delayed-phase component DATA+Δt of the data signal to a clock input terminal ▷ of the flip-flop 120.

In this case, the delay amount Δt delayed by the delay cell 140 may have a value set within a desired (or, alternatively, a predetermined) range smaller than about 0.25 UI. According to an example embodiment, the desired (or, alternatively, the predetermined) range may be from about 0.1 UI to about 0.15 UI, however, it should not be limited thereto or thereby.

As an example, when the delay amount Δt set by the delay cell 140 is about 0.125 UI, the delay cell 140 may apply the set delay amount Δt to the data signal DATA and may generate the delayed-phase component DATA+Δt of the data signal whose phase is delayed by about 0.125 UI.

Meanwhile, the flip-flop 130 may sample the signal Z1 based on the signal Z2 to generate a signal UPx and a signal DNx. In this case, a probability that a state is a fourth state (IV) may be greater than a probability that the state is a first state (I), and as shown in FIG. 4D, the rotational frequency detector 100-4 may have a frequency detection range wider than that of a conventional frequency detector. The rotational frequency detector 100-4 may detect the rotation direction of the data edge in a phasor diagram and outputs a frequency up signal UPprop and frequency down signal DNprop. Meanwhile, an operation of the rotational frequency detector 100-4 using the signal UPx or the signal DNx is irrelevant to a gist of the present disclosure, and thus, details thereof will not be described.

In the above descriptions, example embodiments that utilize the delay cell 140 to adjust the probability of being the fourth state (IV) to be greater than the probability of being the first state (I) are described. In this case, as shown in FIG. 4D, the valid frequency detection is possible in the range where the frequency of the clock signal is low relative to the data rate, however, the present disclosure should not be limited thereto or thereby.

As an example, the frequency detection range may extend by adjusting the probability that the state is the first state (I) to be greater than the probability that the state is the fourth state (IV) using the delay cell 140. As an example, the delay amount Δt of the delay cell 140 may be set to the value between about −0.1 UI and about −0.15 UI in the frequency detector 100-1 of FIG. 4A, and thus, the probability that the state is the first state (I) may be greater than the probability that the state is the fourth state (IV), and in this case, the unidirectional frequency detection that is valid may be possible in the range where the frequency of the clock signal is high based on the data rate.

According to the various example embodiments of the present disclosure, the valid frequency detection may be possible in the wider frequency range. In addition, since the number of phases of the clock used to detect the frequency decreases to one, a manufacturing cost of clock-related circuits may be reduced.

While the present disclosure has been described with reference to some example embodiments thereof, it will be apparent to those of ordinary skill in the art that various changes and modifications may be made thereto without departing from the spirit and scope of the present disclosure as set forth in the following claims.

What is claimed is:

1. A frequency detector, comprising:

a first flip-flop configured to generate a first signal by sampling a clock signal based on a data signal;

a second flip-flop configured to generate a second signal by sampling a delayed-phase component of the clock signal based on the data signal;

a third flip-flop configured to generate a third signal based on the first signal and the second signal such that the third signal represents a polarity of a frequency difference between a data rate of the data signal and a frequency of the clock signal; and a delay cell configured to generate the delayed-phase component of the clock signal such that a delay amount thereof is less than 0.25 Unit Interval (UI).

2. The frequency detector of claim 1, wherein the delay cell is configured to apply the delay amount to the clock signal to generate the delayed-phase component of the clock signal.

3. The frequency detector of claim 1, wherein the delay cell is configured to apply the delay amount such that the delayed-phase component of the clock signal is between 0.1 UI and 0.15 UI.

4. The frequency detector of claim 1, wherein the second flip-flop is configured to sample the delayed-phase component of the clock signal based on the data signal to generate the second signal, and the third flip-flop is configured to sample the first signal based on the second signal to generate the third signal.

5. The frequency detector of claim 4, wherein the first signal has a value of the clock signal, which corresponds to a rising edge of the data signal, and the second signal has a value of the delayed-phase component of the clock signal, which corresponds to the rising edge of the data signal.

6. The frequency detector of claim 5, wherein the frequency detector has four states according to the value of the first signal and the value of the second signal, and the four states including a first state where the first signal is high and the second signal is low, a second state where the first and second signals are high, a third state where the first signal is low and the second signal is high, and a fourth state where the first and second signals are low.

7. The frequency detector of claim 6, wherein the frequency detector is configured to change between the four states when a difference exists between the frequency of the clock signal and the data rate, and the third flip-flop is configured to generate the third signal based on the first signal and the second signal such that the third signal is high when the frequency detector changes from the first state to the second or third state, and the third signal is low when the frequency detector changes from the fourth state to the second or third state.

8. The frequency detector of claim 6, wherein, when the frequency of the clock signal is lower than the data rate, a probability that the frequency detector is the fourth state increases, and a probability that the frequency detector is the first state decreases.

9. The frequency detector of claim 1, wherein the third signal has an average value that is closer to a low value than a high value in an entirety of a frequency offset range in which the frequency of the clock signal is lower than the data rate.

10. The frequency detector of claim 1, wherein the frequency of the clock signal gradually increases from a low value to a high value, and the frequency detector is configured to detect the data rate based on the frequency of the clock signal provided to the frequency detector when an average value of the third signal is zero or is within a margin of error.

11. A frequency detector, comprising:
- a first flip-flop configured to generate a first signal by sampling a clock signal based on a data signal;
- a second flip-flop configured to generate a second signal by sampling the clock signal based on a delayed-phase component of the data signal;
- a third flip-flop configured to generate a third signal based on the first signal and the second signal such that the third signal represents a polarity of a frequency difference between a data rate of the data signal and a frequency of the clock signal; and
- a delay cell configured to generate the delayed-phase component of the data signal such that a delay amount thereof is less than 0.25 Unit Interval (UI).

12. The frequency detector of claim 11, wherein the delay cell is configured to apply the delay amount to the data signal to generate the delayed-phase component of the data signal.

13. The frequency detector of claim 11, wherein the delay cell is configured to apply the delay amount such that the delayed-phase component of the data signal is between 0.1 UI and 0.15 UI.

14. The frequency detector of claim 11, wherein
- the second flip-flop is configured to sample the clock signal based on the delayed-phase component of the data signal to generate the second signal, and
- the third flip-flop is configured to sample the second signal based on the first signal to generate the third signal.

15. The frequency detector of claim 14, wherein
- the first flip-flop is configured to generate the first signal to have a value of the clock signal, which corresponds to a rising edge of the data signal, and
- the second flip-flop is configured to generate the second signal to have a value of the clock signal, which corresponds to a rising edge of the delayed-phase component of the data signal.

16. The frequency detector of claim 15, wherein
- the frequency detector has four states according to the value of the first signal and the value of the second signal, and
- the four states include a first state where the first signal is low and the second signal is high, a second state where the first and second signals are high, a third state where the first signal is high and the second signal is low, and a fourth state where the first and second signals are low.

17. The frequency detector of claim 16, wherein the frequency detector is configured to change between the four states when a difference exists between the frequency of the clock signal and the data rate, and
- the third flip-flop is configured to generate the third signal based on the first signal and the second signal such that the third signal is high when the frequency detector changes from the first state to the second or third state, and the third signal is low when the frequency detector changes from the fourth state to the second or third state.

18. The frequency detector of claim 16, wherein, when the frequency of the clock signal is lower than the data rate, a probability that the frequency detector is in the fourth state increases, and a probability that the frequency detector is in the first state decreases.

19. The frequency detector of claim 11, wherein the third signal has an average value that is closer to a low value than a high value in an entirety of a frequency offset range in which the frequency of the clock signal is lower than the data rate.

20. The frequency detector of claim 11, wherein the frequency of the clock signal gradually increases from a low value to a high value, and the frequency detector is configured to detect the data rate based on the frequency of the clock signal provided to the frequency detector when an average value of the third signal is zero or is within a margin of error.

* * * * *